(12) United States Patent
Ae et al.

(10) Patent No.: US 9,698,569 B2
(45) Date of Patent: Jul. 4, 2017

(54) METHOD FOR MANUFACTURING SEMICONDUCTOR DEVICE AND SEMICONDUCTOR DEVICE

(71) Applicant: RENESAS ELECTRONICS CORPORATION, Kanagawa (JP)

(72) Inventors: Satoshi Ae, Kanagawa (JP); Shoutarou Kitamura, Kanagawa (JP); Tetsuro Okuda, Kanagawa (JP); Suguru Kato, Kanagawa (JP); Isao Watanabe, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 23 days.

(21) Appl. No.: 14/491,798

(22) Filed: Sep. 19, 2014

(65) Prior Publication Data
US 2015/0085888 A1    Mar. 26, 2015

(30) Foreign Application Priority Data

Sep. 20, 2013    (JP) .................................. 2013-196093

(51) Int. Cl.
*H01L 27/15*    (2006.01)
*H01L 29/26*    (2006.01)
(Continued)

(52) U.S. Cl.
CPC .......... *H01S 5/3202* (2013.01); *H01S 5/2272* (2013.01); *H01S 5/2201* (2013.01);
(Continued)

(58) Field of Classification Search
CPC ......... H01L 27/14; H01L 31/18; H01L 33/00; H01L 31/10
(Continued)

(56) References Cited

U.S. PATENT DOCUMENTS

2003/0160249 A1* 8/2003 Sakata ................. H01S 5/0265
257/79
2006/0043518 A1* 3/2006 Nakaji ................... G02B 6/122
257/458
(Continued)

FOREIGN PATENT DOCUMENTS

JP    9-92925    4/1997
JP    H10-79349 A    3/1998
(Continued)

OTHER PUBLICATIONS

R. Kobayashi, et al., "Low Drive-Current and Wide Temperature Operation of 1.3um AlGaInAs-MQW BH-DFB Lasers by Laterally Enhanced Cladding Layer Growth," (2008) OFC2008 OThK2.
(Continued)

*Primary Examiner* — Yuanda Zhang
*Assistant Examiner* — Sheikh Maruf
(74) *Attorney, Agent, or Firm* — McDermott Will & Emery LLP

(57) ABSTRACT

To improve characteristics of a semiconductor device (semiconductor laser), an active layer waveguide (AWG) comprised of InP is formed over an exposed part of a surface of a substrate having an off angle ranging from 0.5° to 1.0° in a [1-1-1] direction from a (100) plane to extend in the [0-1-1] direction. A cover layer comprised of p-type InP is formed over the AWG with a V/III ratio of 2000 or more. Thereby, it is possible to obtain excellent multiple quantum wells (MQWs) by reducing a film thickness variation of the AWG. Moreover, the cover layer having side faces where a (0-11) plane almost perpendicular to a substrate surface mainly appears can be formed. A sectional shape of a lamination part of the cover layer and the AWG becomes an approximately rectangular shape. Therefore, an electrifica-
(Continued)

tion region can be enlarged and it is possible to reduce a resistance of the semiconductor device.

7 Claims, 16 Drawing Sheets

(51) Int. Cl.
    H01L 31/12     (2006.01)
    H01L 33/00     (2010.01)
    H01S 5/32      (2006.01)
    H01S 5/227     (2006.01)
    H01S 5/22      (2006.01)
    H01S 5/343     (2006.01)

(52) U.S. Cl.
    CPC ......... H01S 5/2224 (2013.01); H01S 5/34313 (2013.01); H01S 2304/04 (2013.01)

(58) Field of Classification Search
    USPC ................. 257/76, 79, 98–100; 438/39, 69
    See application file for complete search history.

(56) References Cited

U.S. PATENT DOCUMENTS

| | | | | |
|---|---|---|---|---|
| 2006/0192212 A1* | 8/2006 | Song | .............. | H01L 33/16 257/79 |
| 2006/0231852 A1* | 10/2006 | Kususe | .............. | H01L 24/06 257/99 |
| 2007/0001254 A1* | 1/2007 | Inada | .............. | H01L 31/02165 257/461 |
| 2008/0251808 A1* | 10/2008 | Kususe | .............. | H01L 24/06 257/98 |
| 2010/0051905 A1* | 3/2010 | Iguchi | .............. | B82Y 20/00 257/14 |
| 2010/0189154 A1* | 7/2010 | Makino | .............. | G02B 6/12007 372/50.11 |
| 2010/0190283 A1* | 7/2010 | Katsuyama | .............. | B82Y 20/00 438/39 |
| 2010/0202485 A1* | 8/2010 | Kobayashi | .............. | B82Y 20/00 372/46.01 |
| 2010/0244054 A1* | 9/2010 | Ogihara | .............. | H01L 25/167 257/79 |
| 2010/0301440 A1* | 12/2010 | Watanabe | .............. | H01L 31/105 257/436 |
| 2010/0314722 A1* | 12/2010 | Ishizuka | .............. | H01L 21/76254 257/627 |
| 2011/0169117 A1* | 7/2011 | McIntosh | .............. | H01L 27/1446 257/432 |
| 2011/0261359 A1* | 10/2011 | Inada | .............. | H01L 31/035209 356/437 |
| 2012/0032147 A1* | 2/2012 | Nagai | .............. | A61B 5/14532 257/21 |
| 2012/0309123 A1* | 12/2012 | Tsuji | .............. | H01S 5/2201 438/39 |
| 2013/0048838 A1* | 2/2013 | Mori | .............. | B82Y 20/00 250/214.1 |

FOREIGN PATENT DOCUMENTS

| | | |
|---|---|---|
| JP | 2001-148542 A | 5/2001 |
| JP | 2003-133647 A | 5/2003 |
| JP | 2004-14821 A | 1/2004 |
| JP | 2010-135506 A | 6/2010 |
| JP | 5-110208 A | 12/2012 |

OTHER PUBLICATIONS

H. Q. Houa, et al., "Optical property of InAsP/InP strained quantum wells grown on InP (111)B and (100) substrates," J. Appl. Phys. 75, 4673 (1994), pp. 4673-4679.

Y. Kawamura, et al., "Optical properties of In0.52Al0.48As Layers and In0.53Ga0.47 As/In0.52Al0.48As Quantum Well Structures Grown on (111)B InP Substrates by Molecular Beam Epitaxy," 10th Intern. Conf. on Indium Prosphide and Related Materials, May 11-15, 1998, pp. 556-559.

L. J. Mawst, et al., "High CW Output Power InGaAs/InGaAsP/InGaP Diode Lasers: Effect of Substrate Misorientation," LD Conference (1995) SCL13:5.

Japanese Office Action dated Dec. 6, 2016 issued in Japanese Patent Application No. 2013-196093 with English translation.

* cited by examiner

METHOD FOR MANUFACTURING SEMICONDUCTOR DEVICE AND SEMICONDUCTOR DEVICE

CROSS-REFERENCE TO RELATED APPLICATIONS

The disclosure of Japanese Patent Application No. 2013-196093 filed on Sep. 20, 2013 including the specification, drawings and abstract is incorporated herein by reference in its entirety.

BACKGROUND

The present invention relates to a method for manufacturing a semiconductor device and a semiconductor device, and for example, can be used suitably for a semiconductor device that uses a group III-V compound semiconductor.

As the semiconductor laser (the semiconductor device) that operates at a high speed of 10 to 40 Gbs, a semiconductor material of an InGaAlAs system is used. Specifically, a semiconductor material of the InGaAlAs system is used for an active layer used as an optical waveguide. However, Al (aluminum) in the active layer is easily oxidized and the active layer deteriorates easily by oxidization of Al.

For this reason, for an antioxidant measure of Al, a configuration that adopts a cover layer for covering the active layer is being examined.

For example, Japanese Unexamined Patent Application Publication No. Hei9 (1997)-92925 discloses a semiconductor laser that has a MQW layer above a p-type InP substrate and further has an n-InP layer over this MQW layer.

Moreover, Japanese Unexamined Patent Application Publication No. 2004-14821 discloses a semiconductor laser that uses a (100) off substrate of GaAs.

Moreover, in "Low Drive-Current and Wide Temperature Operation of 1.3 μm AlGaInAs-MQW BH-DFB Lasers by Laterally Enhanced Cladding Layer Growth," R. Kobayashi et al., OFC2008, OThK2 and Japanese Unexamined Patent Application Publication No. Hei5 (1993)-110208, semiconductor lasers formed by selective growth are disclosed; in "Optical property of InAsP/InP strained quantum wells grown on InP (111)B and (100) substrates," H. Q. Houa et al., J. Appl. Phys., 75, 4673 (1994), "Optical properties of In0.52Al0.48As layers and In0.53Ga0.47As/In0.52Al0.48As quantum well structures grown on (111)B InP substrates by molecular beam epitaxy," Y. Kawamural et al., IPRM1998, ThP-11, and "High CW output power InGaAs/InGaAsP/InGaP diode lasers: effect of substrate misorientation," L. J. Mawst et al., LD conference1995, SCL13.5, there are descriptions about growth of epitaxially grown films over inclined substrates.

SUMMARY

The present inventors are being engaged in research and development of the semiconductor lasers that use the group III-V compound semiconductors as described above, and are examining improvement in their performance diligently. During the course of the examination, it has been found that in order to improve performance of the semiconductor laser using the group III-V compound semiconductor, there is room for further improvement about its manufacturing method and structure.

Other problems and new features will become clear from description and accompanying drawings of this specification.

Explaining briefly an outline of a typical embodiment among embodiments that are disclosed in this application, the outline will be as follows.

In a method for manufacturing a semiconductor device disclosed in this application, a first semiconductor layer is grown in a first region of a substrate, and a second semiconductor layer is further grown over the first semiconductor layer. In addition, this substrate inclines by an angle ranging from 0.5° to 1.0° in a [1-1-1] direction from a (100) plane. Moreover, the substrate, the first semiconductor layer, and the second semiconductor layer are comprised of group III-V compound semiconductors.

A semiconductor device shown in the first embodiment disclosed in this application has the first semiconductor layer formed over the first region of the substrate and the second semiconductor layer formed over the first semiconductor layer. In addition, the substrate inclines by an angle ranging from 0.5° to 1.0° n the [1-1-1] direction from the (100) plane, and the substrate, the first semiconductor layer, and the second semiconductor layer are comprised of group III-V compound semiconductors.

According to the method for manufacturing a semiconductor device shown in the typical embodiment that is disclosed in this application and is shown in the following, it is possible to manufacture a semiconductor device with excellent characteristics.

According to the semiconductor device shown in the typical embodiment that is disclosed in this application and is shown in the following, it is possible to improve the characteristics of the semiconductor device.

BRIEF DESCRIPTION OF THE DRAWINGS

FIGS. 1A and 1B are a sectional view and a plan view showing a configuration of a semiconductor device of a first embodiment, in which FIG. 1A is the sectional view and FIG. 1B is the plan view;

DETAIL DESCRIPTION

Figure 1A:
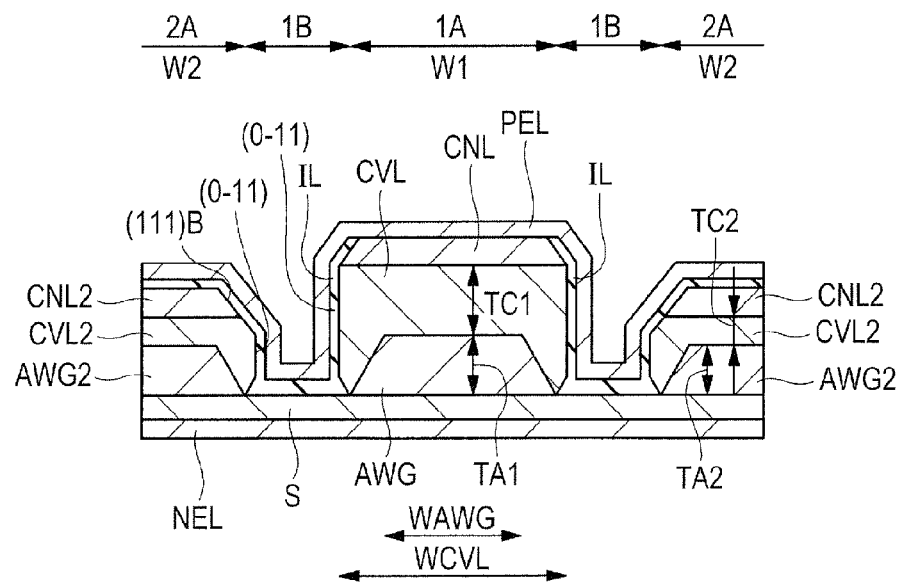

In the following embodiments, when there is a necessity for convenience, they are divided into multiple sections or embodiments and explanations are given to them. However, they are not mutually irrelevant, and one section or embodiment is in a relationship of a modification, an application example, a detailed explanation, a supplementary explanation, etc. of a part or the whole of the other section or embodiment, except for the case where it is specifically indicated. Moreover, in the following embodiments, when referring to the number of components, etc. (including a number, a numerical value, a quantity, a range, etc.), each embodiment is not limited to the specific number and the number is not limited to the specific number and may be more than or less than the specific number except for the case where it is specifically indicated, the case where it is clearly limited to the specific number fundamentally, and the like.

Furthermore, in the following embodiments, their components (including an element step, etc.) are not necessarily indispensable except for the case where it is specifically indicated, the case where it is considered clearly indispensable fundamentally that it is clearly indispensable, and the like. Similarly, in the following embodiment, when referring to a shape, a positional relationship, etc. of the component, etc., it shall include one that is substantially approximate or analogous to its shape, etc. except for the case where it is specifically indicated, the case where it is considered clearly not so theoretically, etc. This applies also to the above-mentioned number, etc. (including the number, the numerical value, the quantity, the range, etc.).

Hereinafter, embodiments will be explained in detail based on drawings. Incidentally, in all the diagrams for explaining the embodiment, the same or a relevant sign is given to the component that has the same function, and its repeated explanation is omitted. Moreover, when multiple similar members (portions) exist, there is a case where a sign may be added to a sign of the generic term to indicate an individual or specific portion. Moreover, in the following embodiment, an explanation of the same or similar portion is not repeated in principle except for the case where it is especially necessary.

Moreover, in drawings used in the embodiments, there may be a case where hatching is omitted in order to make the drawing easy to see even when it is a sectional view. Moreover, there may be a case where hatching may be attached in order to make the drawing easy to see, even when it is a plan view.

Moreover, in a sectional view and a plan view, a size of each portion does not correspond to an actual device, and there may be a case where a specific portion is displayed relatively largely in order to make the drawing intelligible. Moreover, in the case where a sectional view and a plan view correspond to each other, there may be a case where a specific portion is displayed relatively largely in order to make the drawing intelligible.

First Embodiment

Figure 1B:
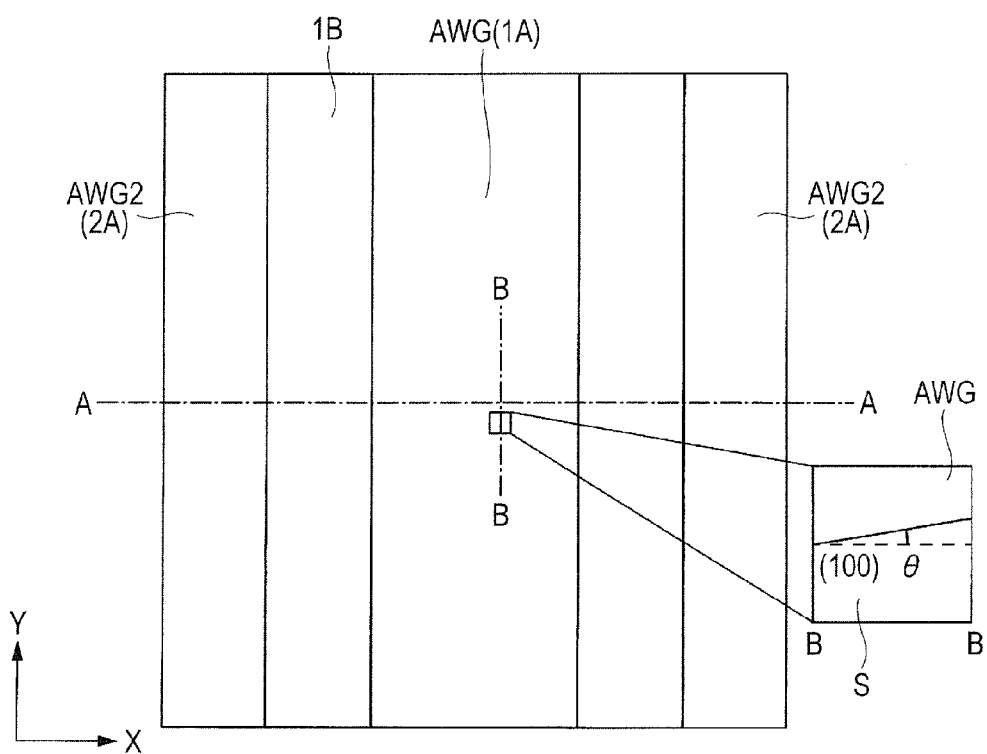
Figure 2:
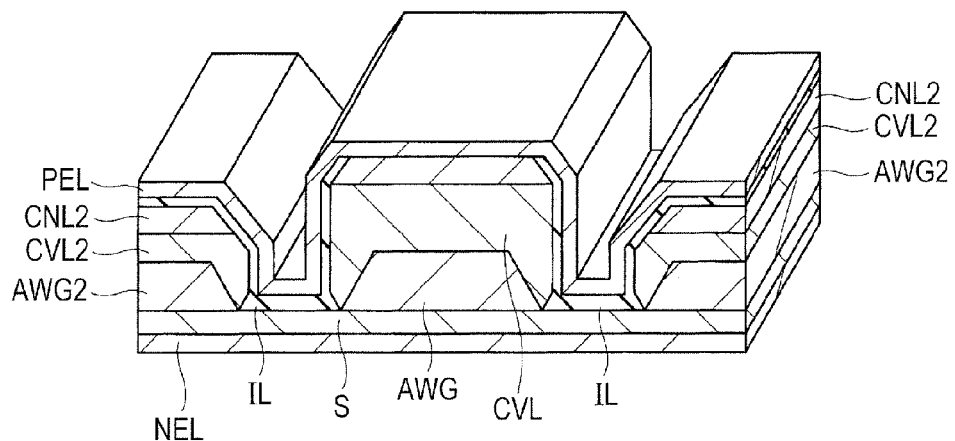
FIG. 2 is a perspective view showing the configuration of the semiconductor device of the first embodiment.

Hereinafter, a semiconductor device of this embodiment will be described in detail, referring to drawings. FIGS. 1A and 1B are a sectional view and a plan view, respectively, showing a configuration of the semiconductor device of this embodiment. FIG. 2 is a perspective view showing the configuration of the semiconductor device of this embodiment. FIG. 3 to FIG. 11 are sectional views showing a manufacturing process of the semiconductor device of this embodiment.

[Structure Explanation]

FIGS. 1A and 1B are views showing the configuration of the semiconductor device of this embodiment, in which FIG. 1A is the sectional view and FIG. 1B is the plan view. FIG. 1A corresponds to a section A-A of FIG. 1B, for example. The semiconductor device shown in FIGS. 1A and 1B is a semiconductor laser (also called a compound semiconductor laser). This semiconductor device is a ridge type semiconductor laser that uses a group III-V compound semiconductor, especially, InP.

As shown in FIG. 1A and FIG. 2, the semiconductor device of this embodiment has a substrate S, an active layer waveguide AWG arranged over a region 1A of the substrate S, and a cover layer CVL arranged over the active layer waveguide AWG. Over the cover layer CVL, a p-electrode (a p-side electrode, an upper part electrode) PEL is arranged through a contact layer CNL, and an n-electrode (an n-side electrode, a lower part electrode) NEL is arranged on a rear face side of the substrate S. The substrate S, the cover layer CVL, and the contact layer CNL are comprised of group III-V compound semiconductors (semiconductor layers).

Moreover, as shown in FIG. 1B, the region 1A of the substrate S, i.e., a formation region of the active layer waveguide AWG is an approximately rectangular region extending in the Y-direction (a depth direction of FIG. 1A). In other words, it is a region that has a long side in the Y-direction (the depth direction of FIG. 1A, a [1-1-1] direction). Regions 1B are arranged over both ends of this region 1A. In other words, the region 1A is demarcated by the regions 1B. Regions 2A are arranged outside the regions 1B. In each of these regions 2A, an active layer waveguide AWG2, a cover layer CVL2, and a contact layer CNL2 are arranged sequentially from the bottom (refer to FIG. 1A).

The substrate S is comprised of n-type (a first conductivity type) InP and is an inclined substrate whose surface inclines by an angle ranging from 0.5° to 1.0° in a [1-1-1] direction from a (100) plane (refer to FIG. 1B). Such an angle is called an off angle (also called a substrate inclination angle), and this inclined substrate is a substrate that has the off angle. Moreover, the surface of the substrate S is a surface that has the off angle. In FIG. 1B, the off angle is shown by θ. That is, as shown in FIG. 1B, in a section B-B, the surface of the substrate S has the off angle θ with respect to the (100) plane.

The active layer waveguide AWG is comprised of non-doped InGaAlAs. This active layer waveguide AWG is formed by epitaxial growth. In this formation, since the substrate S has the above-mentioned off angle, a surface of the active layer waveguide AWG after the growth inclines by an angle ranging from 0.5° to 1.0° in the [1-1-1] direction from the (100) plane. This active layer waveguide AWG is also called a multiple quantum well (MQW) layer comprised of InGaAlAs.

The cover layer CVL is comprised of a p-type (a second conductivity type) InP layer. This cover layer CVL is formed by epitaxial growth over the active layer waveguide AWG. A sectional shape of a lamination part (also called a mesa part) of the cover layer CVL after the growth and the active layer waveguide AWG becomes an approximately rectangular shape. Specifically, a width (WCVL) of a surface of the cover layer CVL becomes larger than a width (WAWG) of the surface of the active layer waveguide AWG. Moreover, side faces (side walls) of the lamination part of the cover layer CVL and the active layer waveguide AWG each have a (0-11) plane that is almost perpendicular to the surface of the substrate S. Thus, by making a sectional shape of the lamination part of the cover layer CVL and the active layer waveguide AWG into the approximately rectangular shape, the electrification region can be enlarged (refer to FIG. 13), and it is possible to reduce a resistance of the semiconductor device at the time of its operation.

The contact layer CNL is comprised of a group III-V compound semiconductor, and is comprised of, for example, a p-type InGaAs layer. This contact layer CNL is arranged over the cover layer CVL.

The dielectric film IL is comprised of an insulator film such as a silicon oxide film. This dielectric film IL is not arranged over a top face of the contact layer CNL, and the top face of the contact layer CNL is exposed from an opening of the dielectric film IL.

The p-electrode PEL is comprised of multi-layered films of, for example, a palladium (Pd) film and a platinum (Pt) film. The p-electrode PEL is arranged over the top face of the contact layer CNL that is exposed from the opening of the dielectric film IL. Moreover, the n-electrode NEL is comprised of multi-layered films of, for example, a titanium (Ti) film and a gold (Au) film. The n-electrode NEL is arranged over a rear face of the substrate S.

The active layer waveguide AWG2 is formed similarly with the active layer waveguide AWG, and is comprised of the same material as that of the active layer waveguide AWG. However, since an X-direction width (W2) of the region 2A in which the active layer waveguide AWG2 is formed is larger than an X-direction width (W1) of the region 1A in which the active layer waveguide AWG is formed, a growth rate per unit area becomes larger than that of the region 2A in the region 1A. Therefore, a film thickness TA1 of the active layer waveguide AWG becomes larger than a film thickness TA2 of the active layer waveguide AWG2 (TA1>TA2). Similarly, the cover layer CVL2 is formed similarly with the cover layer CVL and is comprised of the same material as that of the cover layer CVL. However, since the width (W2) of the region 2A in the X-direction is larger than the width (W1) of the region 1A in the X-direction, a film thickness TC1 of the cover layer CVL becomes larger than a film thickness TC2 of the cover layer CVL2 (TC1>TC2). Moreover, as described above, side faces of the cover layer CVL each have the (0-11) plane perpendicular to the (100) plane, whereas the side faces of the cover layer CVL2 do not become a perfect approximately rectangular shape because the film thickness of the cover layer CVL2 becomes thinner than that of the cover layer CVL, and each have a (111)B plane in addition to the (0-11) plane. The (111)B plane is a plane on whose surface a group V element mainly exposes among (111) planes.

The contact layer CNL2 is formed similarly with the contact layer CNL, and is comprised of the same material as that of the contact layer CNL. Since the p-electrode PEL is arranged over the contact layer CNL2 through the dielectric film IL, the contact layer CNL2, the active layer waveguide AWG2, and the cover layer CVL2 do not contribute to an operation of the semiconductor device (the semiconductor laser) that will be described later. Thus, although each layer (AWG2, CVL2, CNL2) of the region 2A is a layer that does not contribute to the operation of the semiconductor device (the semiconductor laser), the each is needed in order to improve satisfactorily controllability of a composition of the active layer waveguide AWG (InGaAlAs) of the region 1A and controllability of a planar shape (approximately rectangular) of the cover layer CVL.

Next, one example of the operation of the semiconductor device (the semiconductor laser) will be explained. First, a positive voltage is applied to the p-electrode PEL and, at the same time, a negative voltage is applied to the n-electrode NEL. Thereby, a forward current flows toward the n-electrode NEL from the p-electrode PEL, and holes are injected into the active layer waveguide AWG from the p-electrode PEL through the contact layer CNL and the cover layer CVL. On the other hand, electrons injected into the active layer waveguide AWG from the n-electrode NEL through the substrate S.

In the active layer waveguide AWG, an inverted population is formed with holes and electrons that are injected and stimulated emission by which the electron transits from a conduction band to a valence band occurs. Thereby, light whose rays have a uniform phase is generated. Then, the light generated in the active layer waveguide AWG is confined in the active layer waveguide AWG by surrounding semiconductors (the cover layer CVL and the substrate S) whose refractive indices are lower than that of the active layer waveguide AWG. Then, the light confined in the active layer waveguide AWG is amplified by further stimulated emission by the light making round trips in a resonator comprised of cleaved facets (laser end faces) formed in the semiconductor laser. Then, a laser beam oscillates within the active layer waveguide AWG, and the laser beam is emitted from the semiconductor device.

[Process Explanation]

Next, referring to FIG. 3 to FIG. 11, a method for manufacturing a semiconductor device of this embodiment will be explained and, at the same time, the configuration of the semiconductor device will be made clearer. FIG. 3 to FIG. 11 are sectional views showing a manufacturing process of the semiconductor device of this embodiment.

Figure 3:
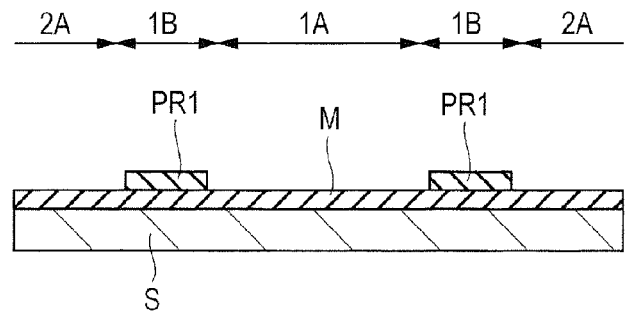
FIG. 3 is a sectional view showing a manufacturing process of the semiconductor device of the first embodiment.

As shown in FIG. 3, a dielectric mask M is formed over the substrate S. The substrate S is comprised of n-type InP, and is an inclined substrate whose surface inclines by an angle ranging from 0.5° to 1.0° in the [1-1-1] direction from the (100) plane (refer to FIG. 1B), as described above.

Over the substrate S that is such an inclined substrate, for example, a silicon oxide film is deposited to a film thickness of about 100 nm as the dielectric mask M using a chemical vapor deposition (CVD) method, etc. Next, a photoresist film PR1 of the region 1A that is the formation region of the active layer waveguide AWG and the regions 2A are removed by forming the photoresist film PR1 over the dielectric mask M and exposing and developing it. In other words, the photoresist film PR1 is made to remain in the regions 1B surrounding the region 1A that is the formation region of the active layer waveguide AWG.

The region 1A that is the formation region of this active layer waveguide AWG is a stripe shape extending in the [0-1-1] direction (refer to FIG. 1B).

Figure 4:
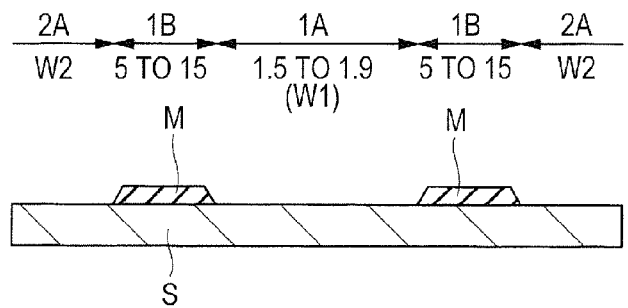
FIG. 4 is a sectional view showing the manufacturing process of the semiconductor device of the first embodiment, and is the sectional view showing manufacturing steps following FIG. 3.

Next, the dielectric mask M is etched by using the photoresist film PR1 as a mask. After this, the photoresist film PR1 is removed. Thereby, as shown in FIG. 4, the dielectric mask M with the opening in the region 1A that is the formation region of the active layer waveguide AWG is formed. In other words, the dielectric mask M is formed in the regions 1B surrounding the region 1A that is the formation region of the active layer waveguide AWG. A width of this opening is about 1.5 to 1.9 μm, for example. This width corresponds to the width W1 of the region 1A in the X-direction. Then, from this opening, a surface of the substrate S having the off angle is exposed. Moreover, the width of a remaining dielectric mask M is about 5 to 15 μm. In a sectional view of FIG. 4, the dielectric mask M remains on both sides of the formation region (the region 1A) of the active layer waveguide AWG. In other words, the dielectric mask M about 5 to 15 μm wide is formed with a gap of about 1.5 to 1.9 μm set inbetween. Moreover, the regions 2A are arranged outside the regions 1B. In FIG. 4, etc., although only parts of the regions 2A are illustrated, the width of this region 2A (the width W2 in the X-direction) is, for example, about 250 μm.

Figure 5:
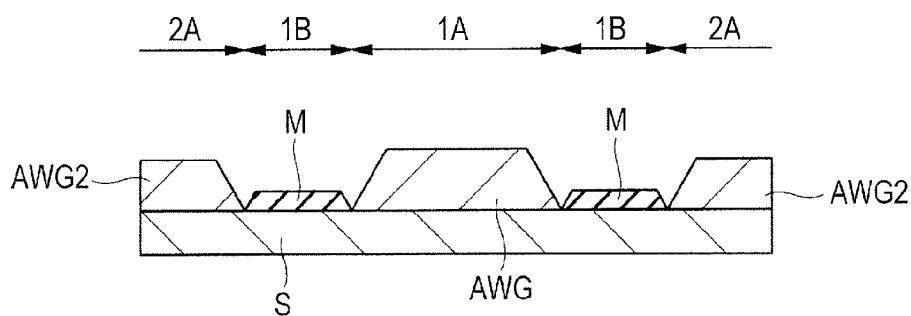
FIG. 5 is a sectional view showing the manufacturing process of the semiconductor device of the first embodiment, and is the sectional view showing manufacturing steps following FIG. 4.

Next, as shown in FIG. 5, the active layer waveguide AWG is formed over the above-mentioned opening (the region 1A), i.e., the exposed part of the surface that has the off angle of the substrate S. Here, an InP layer that is a group III-V compound semiconductor is formed as the active layer waveguide AWG using a metal organic vapor phase epitaxy (MOVPE) method, etc. In the MOVPE method, a source gas of a group III element and a source gas of a group V element are introduced into a chamber (a processing chamber) using a carrier gas, and an InGaAlAs layer is grown in the opening (the region 1A). TMIn (tri-methyl-indium), TEGa (tri-ethyl-gallium), and TMAl (tri-methyl-aluminum) can be used as source gases of In (indium), Ga (gallium), and Al (aluminum). Moreover, $AsH_3$ (arsine) can be used as a source gas of As (arsenic). When mixed source gases arrive at the surface of the heated substrate S, chemical reactions such as decomposition arise, and the InGaAlAs layer grows (deposits) in a state where it succeeds crystalline information of a lower stratum. For example, by setting a ratio (also called a V/III ratio) of the flow rate of the source gas of the group V element (here arsine) to a sum of the flow rates of the source gases of the group III elements (here TMIn, TEGa, TMAl) to 200 or less, the active layer waveguide AWG (the InGaAlAs layer) AWG is formed. In this formation, the active layer waveguide AWG2 is formed in the region 2A.

Figure 6:
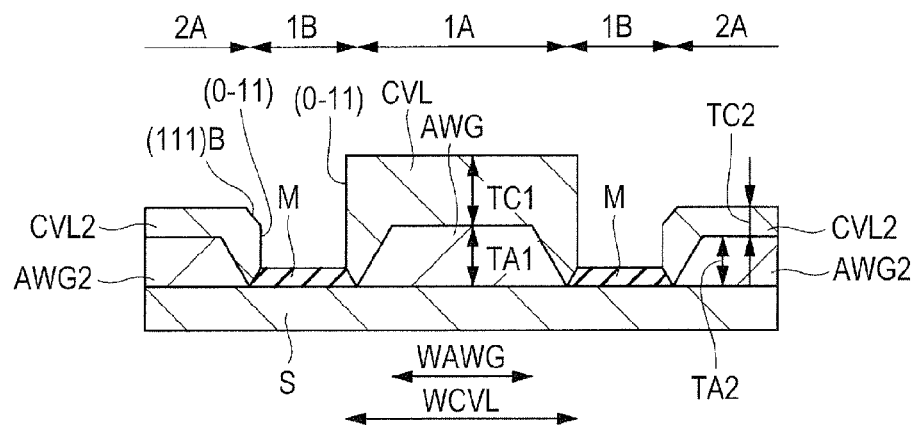
FIG. 6 is a sectional view showing the manufacturing process of the semiconductor device of the first embodiment, and is the sectional view showing manufacturing steps following FIG. 5.

Subsequently, as shown in FIG. 6, the cover layer CVL is formed over the active layer waveguide AWG. Here, a p-type InP layer that is a group III-V compound semiconductor is formed as the cover layer CVL using the MOVPE method, etc. That is, the p-type InP layer is formed continuously (consecutively) in the chamber (the processing chamber) in which the active layer waveguide AWG was formed. In this formation, TMIn is used as a source gas of In, $PH_3$ (phosphine) is used as a source gas of P (phosphorus), and the V/III ratio is set to 2000 or more. Moreover, the p-type InP layer is formed while doping a p-type impurity. As the p-type impurity, Zn can be used, and the p-type InP layer can be formed, for example, by mixing DEZn (di-ethyl-zinc) in the source gas. In this formation, the cover layer CVL2 is formed in the regions 2A.

Figure 7:
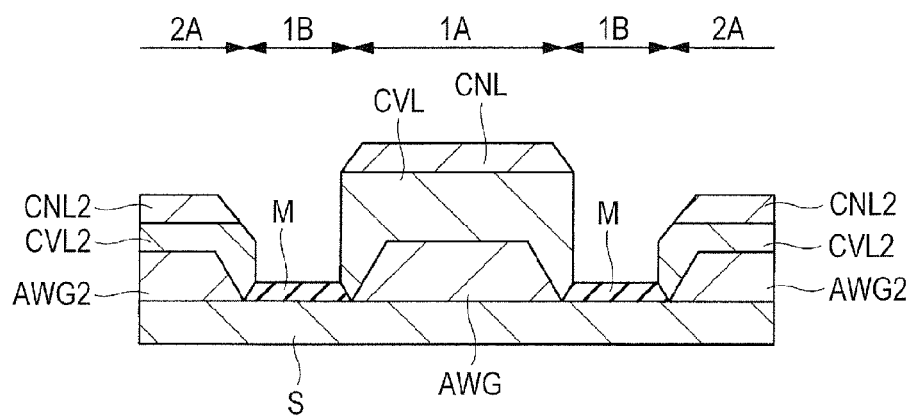
FIG. 7 is a sectional view showing the manufacturing process of the semiconductor device of the first embodiment, and is the sectional view showing manufacturing steps following FIG. 6.

Next, as shown in FIG. 7, the contact layer CNL is formed over the cover layer (the p-type InP layer) CVL. Here, as the contact layer CNL, the p-type InGaAs layer that is a group III-V compound semiconductor is formed using the MOVPE method, etc. That is, the p-type InGaAs layer is continuously formed in the chamber (the processing chamber) in which the active layer waveguide AWG and the cover layer CVL were formed. In this formation, for example, TMIn is used as the source gas of In, TMGa (tri-methyl-gallium) is used as a source gas of Ga (gallium), and $AsH_3$ (arsine) is used as the source gas of As (arsenic). Then, the V/III ratio (here, a ratio of the flow rate of the arsine that is the source gas of the group V element to a sum of the flow rates of TMIn and TMGa that are source gases of the group III elements) is set to 100 or less. Moreover, the p-type InGaAs layer is formed while doping a p-type impurity. As a p-type impurity, Zn can be used, and the p-type InGaAs layer can be formed, for example, by mixing DEZn in the source gas. In this formation, the contact layer CNL2 is formed in the regions 2A.

As mentioned above, in the region 1A of the substrate S, the active layer waveguide AWG, the cover layer CVL, and the contact layer CNL are grown sequentially from the bottom, continuously and collectively. In this growth, the active layer waveguide AWG2, the cover layer CVL2, and the contact layer CNL2 grow sequentially from the bottom in the region 2A. As described above, since the width (W2) of the region 2A is larger than the width (W1) of the region 1A, the growth rate per unit area becomes large in the region 1A. Therefore, the film thickness TA1 of the active layer waveguide AWG becomes larger than the film thickness TA2 of the active layer waveguide AWG2 (TA1>TA2, refer to FIG. 6). Similarly, the film thickness TC1 of the cover layer CVL becomes larger than the film thickness TC2 of the cover layer CVL2 (TC1>TC2, refer to FIG. 6). Moreover, the side faces of the cover layer CVL2 will be in a state where the (111)B plane that is a grown plane before the (0-11) plane is exposed remains. Thereby, the side faces of the cover layer CVL each have the (0-11) plane perpendicular to the (100) plane, whereas the side faces of the cover layer CVL2 each have the (111)B plane in addition to the (0-11) plane. Incidentally, the contact layers CNL, CNL2 do not grow on the (0-11) plane perpendicular to the (100) plane and the (111)B plane, but the contact layers CNL, CNL2 mainly grow over the top faces of the cover layers CVL, CVL2.

Thus, since the active layer waveguide AWG was formed so as to extend in the [0-1-1] direction over the surface of the substrate S that has the off angle in the range of 0.5° to 1.0° in the [1-1-1] direction from the (100) plane, a variation of the film thickness (also called a well thickness) of the active layer waveguide AWG can be reduced, and it is possible to obtain an excellent multiple quantum wells (MQW). Moreover, since the cover layer CVL comprised of a group III-V compound semiconductor is formed over the active layer waveguide AWG with a high V/III ratio more than or equal to 2000, the cover layer CVL that has the side faces in which the (0-11) plane almost perpendicular to the surface of the substrate S mainly appears can be formed from the end of the dielectric mask M. Moreover, since the contact layers CNL, CNL2 that are formed over the cover layers CVL, CVL2 and are comprised of a group III-V compound semiconductor are formed with a low V/III ratio, the contact layers CNL, CNL2 do not grow on the (0-11) plane almost perpendicular to the substrate S and the (111) plane, but the contact layers CNL, CNL2 mainly grow over the top faces of the cover layers CVL, CVL2.

Figure 8:
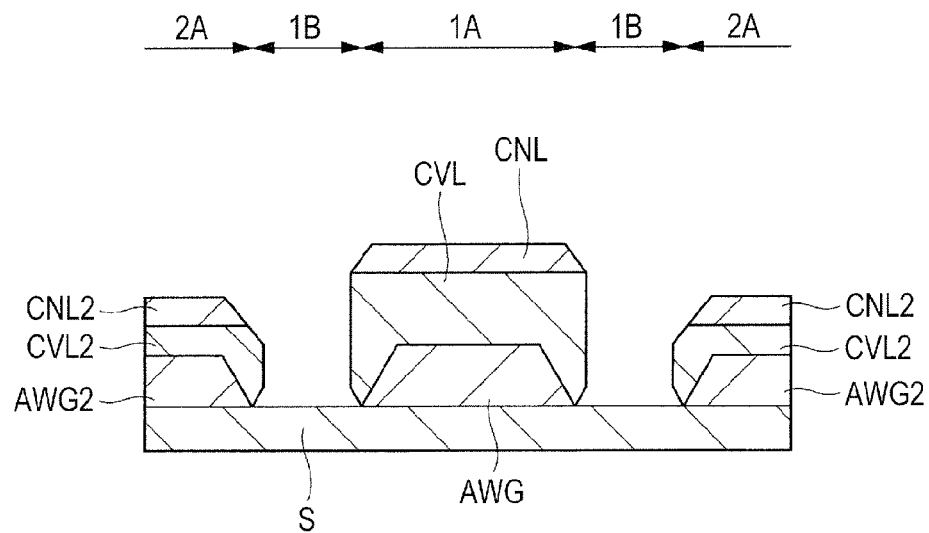
FIG. 8 is a sectional view showing the manufacturing process of the semiconductor device of the first embodiment, and is the sectional view showing manufacturing steps following FIG. 7.
Figure 9:
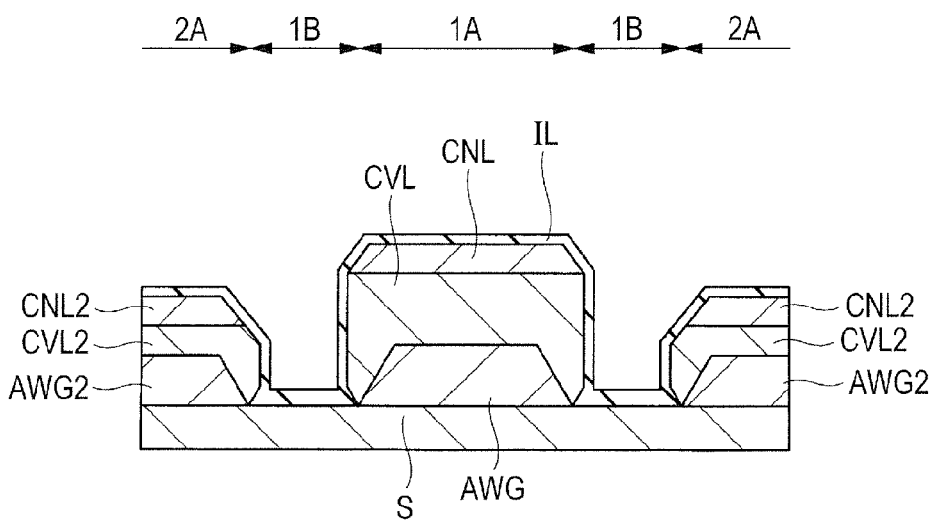
FIG. 9 is a sectional view showing the manufacturing process of the semiconductor device of the first embodiment, and is the sectional view showing manufacturing steps following FIG. 8.
Figure 10:
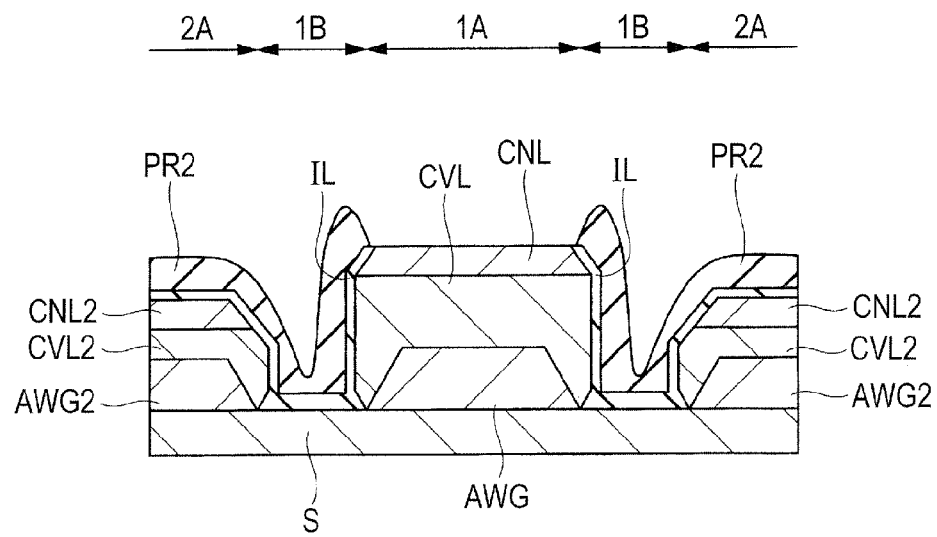
FIG. 10 is a sectional view showing the manufacturing process of the semiconductor device of the first embodiment, and is the sectional view showing manufacturing steps following FIG. 9.

Next, as shown in FIG. 8, the dielectric mask M is removed by etching. Next, as shown in FIG. 9, for example, a silicon oxide film is deposited above the substrate S to a film thickness of about 300 nm using the CVD method, etc. as the dielectric film IL. Next, as shown in FIG. 10, by forming a photoresist film PR2 above the dielectric film IL and exposing and developing it, the photoresist film PR2 above the contact layer CNL (the region 1A) is removed. Next, the dielectric film IL is etched by using the photoresist film PR2 as a mask. After this, the photoresist film PR2 is removed. Thereby, the top face of the contact layer CNL is exposed from the opening of the dielectric film IL. In other words, a region other than the top face of the contact layer CNL is covered with the dielectric film IL. That is, the cover layer CVL2 is covered with the dielectric film IL.

Figure 11:
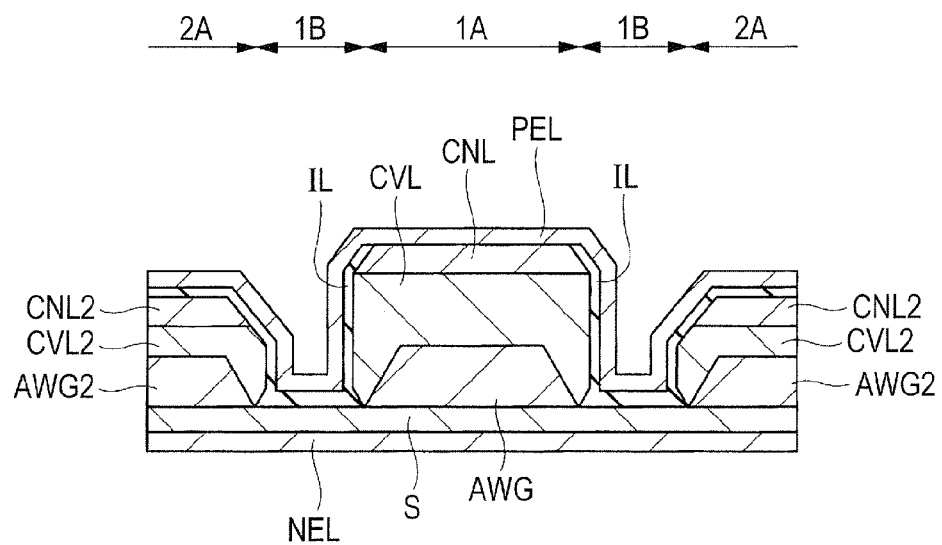
FIG. 11 is a sectional view showing the manufacturing process of the semiconductor device of the first embodiment, and is the sectional view showing manufacturing steps following FIG. 10.

Next, as shown in FIG. 11, the p-electrode PEL is formed over the contact layer CNL. Moreover, the n-electrode NEL is formed over the rear face of the substrate S. For example, the multi-layered films of, for example, the palladium (Pd) film and the platinum (Pt) film are formed over the dielectric film IL that includes the exposed part of the contact layer CNL. These films can be formed using a spattering technique, an evaporation method, etc. Next, the p-electrode PEL is formed by patterning the multi-layered films to a desired shape. Next, the substrate S is thinned by making the rear face side of the substrate S face upward and grinding the rear face of the substrate S. Next, the multi-layered films of, for example, the titanium (Ti) film and the gold (Au) film are formed over the rear face of the substrate S as the n-electrode NEL. These films can be formed using the spattering technique, the evaporation method, etc. Incidentally, other metallic films may be used as the p-electrode PEL and the n-electrode NEL.

By the above process, the semiconductor device shown in FIG. 1 can be formed.

Thus, according to this embodiment, since the active layer waveguide AWG is formed over the substrate S having the off angle and the cover layer CVL is formed over it with the high V/III ratio, a growth section of the cover layer CVL becomes large, and the electrification region width can be secured. Therefore, lower resistance of the semiconductor device can be attained.

Figure 12:
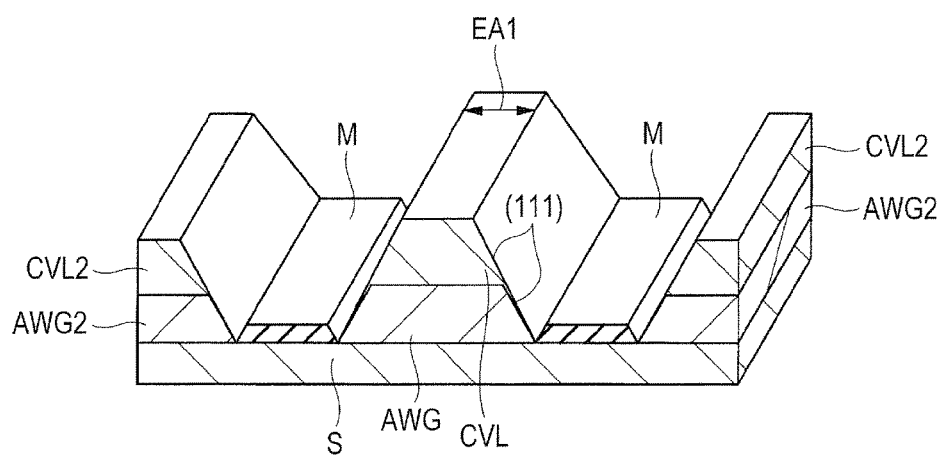
FIG. 12 is a perspective view showing an electrification region of a semiconductor device of a comparative example.
Figure 13:
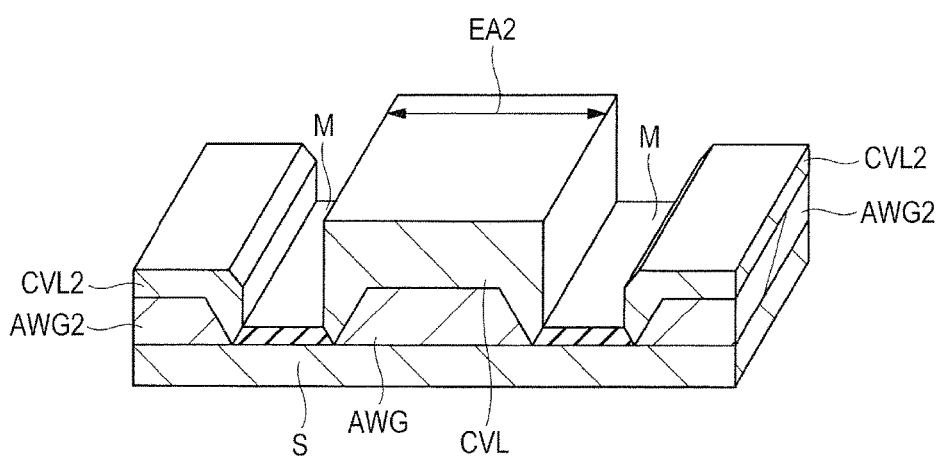
FIG. 13 is a perspective view showing an electrification region of the semiconductor device of the first embodiment.

FIG. 12 is a perspective view showing an electrification region of a semiconductor device of a comparative example. FIG. 13 is a perspective view showing an electrification region of the semiconductor device of this embodiment.

In the semiconductor device shown in FIG. 12, the active layer waveguide AWG is formed over the (100) plane of the substrate S that does not have the off angle, and the cover layer CVL is formed over it. In this case, the side faces of the active layer waveguide AWG and the cover layer CVL become the (111) plane that is oblique to the surface (the (100) plane) of the substrate S by 54.7°. In this formation, if the film thickness is enlarged in order to enlarge the growth section of the cover layer CVL, a top face of the cover layer CVL, i.e., the electrification region EA1 will become small to the growth section. Thereby, the resistance of the semiconductor device at the time of its operation will increase. Moreover, by an increase of the resistance, heat generation becomes large and a temperature characteristic of the semiconductor device falls.

On the other hand, in this embodiment, the active layer waveguide AWG is formed so as to extend in the [0-1-1] direction over the exposed part of the surface of the substrate S that has the off angle in the range of 0.5° to 1.0° in the [1-1-1] direction from the (100) plane, and further the cover layer CVL is formed over its upper part with the high V/III ratio more than or equal to 2000. The cover layer CVL can be formed so as to have the side faces in each of which the (0-11) plane almost perpendicular to the surface of the substrate S may appear mainly. That is, since the cover layer CVL grows so as to be side faces almost perpendicular to the surface of the substrate S, an electrification region EA2 corresponding to the formation region (the region 1A) of the active layer waveguide AWG can be secured. For example, a width of the electrification region EA2 can be set to about 1.5 to 1.9 μm.

On the other hand, in order to form the cover layer CVL that has side faces almost perpendicular to the surface of the substrate S, a method of setting the surface of the substrate S to the (111) plane is considerable (for example, refer to Japanese Unexamined Patent Application Publication No. Hei5 (1993)-110208). However, in the case where the active layer waveguide AWG is formed over the (111) plane or a plane that has the off angle of not less than 2° from the (100)

plane, its crystallinity will deteriorate and a PL FWHM will widen (refer to "Optical property of InAsP/InP strained quantum wells grown on InP (111)B and (100) substrates," H. Q. Houa et al., J. Appl. Phys., 75, 4673 (1994), "Optical properties of In0.52Al0.48As layers and In0.53Ga0.47As/ In0.52Al0.48 As quantum well structures grown on (111)B InP substrates by molecular beam epitaxy," Y. Kawamural et al., IPRM1998, ThP-11, and "High CW output power InGaAs/InGaAsP/InGaP diode lasers: effect of substrate misorientation," L. J. Mawst et al., LD conference1995, SCL13.5).

Figure 14:
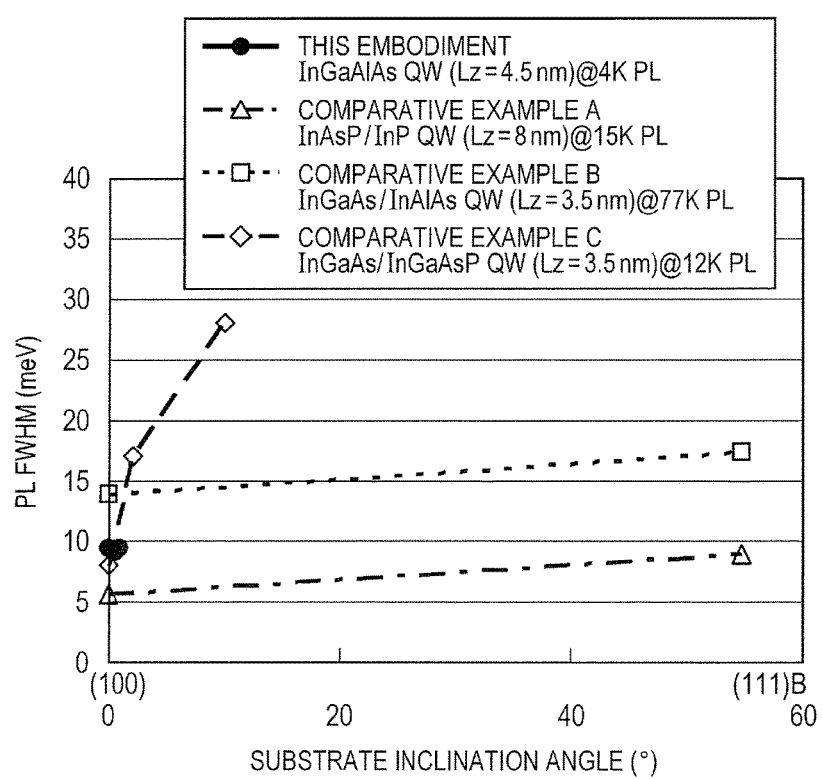
FIG. 14 is a graph showing a relationship between a PL FWHM and a substrate inclination angle.
Figure 15:
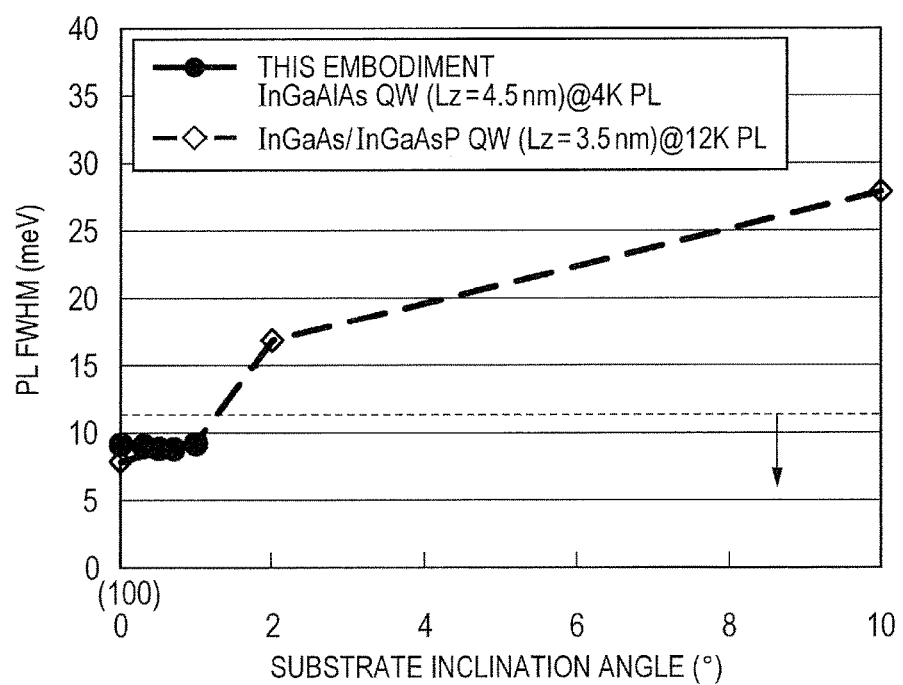
FIG. 15 is a partial enlarged view of the graph of FIG. 14.

Matters that the present inventors examined about the inclination angle of the substrate and the PL FWHM will be explained below. FIG. 14 is a graph showing a relationship between the PL FWHM and the substrate inclination angle. FIG. 15 is a partial enlarged view of the graph of FIG. 14. The horizontal axes of FIG. 14 and FIG. 15 are the substrate inclination angle [°], and the vertical axes are the photo luminescence full width at half maximum (PL FWHM) [meV].

In the case of the semiconductor device of this embodiment (in the case of solid circles), as shown in FIG. 14 and FIG. 15, the substrate inclination angle is in the range of 0° to 1.0°, and the PL FWHM is about 9 meV and stable. In other words, an increase in the PL FWHM is not observed.

On the other hand, when the present inventors computed it based on various pieces of data of the semiconductor devices described in "Optical property of InAsP/InP strained quantum wells grown on InP (111)B and (100) substrates," H. Q. Houa et al., J. Appl. Phys., 75, 4673 (1994), "Optical properties of In0.52Al0.48As layers and In0.53Ga0.47As/ In0.52Al0.48 As quantum well structures grown on (111)B InP substrates by molecular beam epitaxy," Y. Kawamural et al., IPRM1998, ThP-11, and "High CW output power InGaAs/InGaAsP/InGaP diode lasers: effect of substrate misorientation," L. J. Mawst et al., LD conference1995, SCL13.5, the increase in the PL FWHM was verified. The semiconductor devices described in the above-mentioned non-patent documents are designated as a comparative example A, a comparative example B, and a comparative example C, respectively. As shown in FIG. 14 and FIG. 15, in the comparative example A, the PL FWHM increases to about 6 to 9 meV. Moreover, in the comparative example B, the PL FWHM increases to about 14 to 17 meV. Moreover, in the comparative example C, the PL FWHM increases to about 8 to 28 meV.

Incidentally, in this embodiment, the PL FWHM was measured about PL at a temperature 4K when the active layer waveguide AWG is designed to be InGaAlAs whose layer thickness Lz) is 4.5 nm. Moreover, in the comparative example A, the PL FWHM was computed about the PL at a temperature 15K when the active layer (QW) is InAsP/InP whose layer thickness (Lz) is 8 nm. Moreover, in the comparative example B, the PL FWHM was computed about the PL at a temperature 77K when the active layer is InGaAs/InAlAs whose layer thickness (Lz) is 3.5 nm. Moreover, in the comparative example C, the PL FWHM was computed about PL at a temperature 12K when the active layer is InGaAs/InGaAsP whose film thickness (Lz) is 3.5 nm.

Thus, although materials and temperatures are different, it has been checked successfully that in the substrate that has the off angle such that the inclination angle from the (100) plane is more than or equal to 2°, the PL FWHM widens, and that in the substrate that has the off angle such that the inclination angle from the (100) plane is in the range of 0° to 1.0° like this embodiment, the increase in the PL FWHM is controlled.

Thus, in this embodiment, it has been proved that the increase in the PL FWHM is suppressed, i.e., fluctuation of a quantum well width of the active layer waveguide AWG is controlled, and that the EA2 can be enlarged while maintaining excellent crystallinity.

Figure 16:
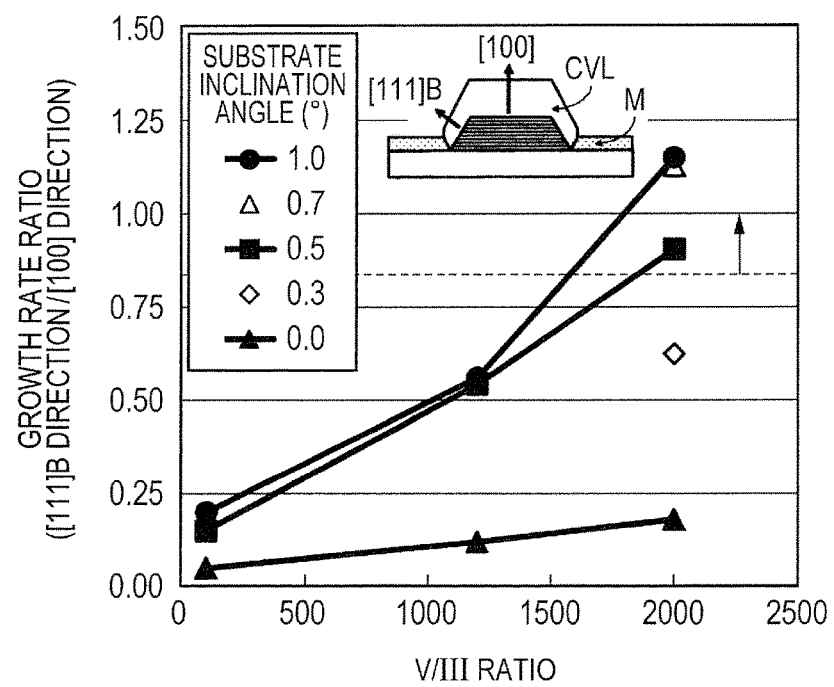
FIG. 16 is a graph showing a relationship between the V/III ratio and a ratio of a growth rate of the [111]B direction relative to a growth rate of the [100] direction at the time of formation of a cover layer.

Furthermore, by forming the cover layer CVL with the high V/III ratio, in growth of the cover layer CVL, a ratio of a growth rate of the [111]B direction to a growth rate of the direction (growth rate of the [111]B direction/growth rate of [100] direction) increases. FIG. 16 is a graph showing the relationship between the V/III ratio at the time of formation of the cover layer and the ratio of the growth rate of the [111]B direction to the growth rate of the [100] direction. A horizontal axis represents the V/III ratio and a vertical axis represents the growth rate ratio. A width of the opening (the region 1A) of the dielectric mask M was set to about 1.5 to 1.9 μm and a width of the dielectric mask M was set to about 5 to 15 μm, for example.

When the cover layer CVL is formed with the high V/III ratio, the ratio of the growth rate of the [111]B direction to the growth rate of the [100] direction (growth rate of the [111]B direction/growth rate of the [100] direction) increases, but growth that covers over the dielectric mask M is hardly seen.

Moreover, as shown in FIG. 16, by setting the V/III ratio to 2000 or more, the ratio of the growth rate of the [111]B direction to that of the [100] direction becomes 0.8 or more, becoming high. Thus, since the growth of the [111]B direction is promoted, the side faces of the cover layer CVL become almost perpendicular to the surface of the substrate S as shown in FIG. 1, and the sectional shape of the lamination part of the cover layer CVL and the active layer waveguide AWG becomes the approximately rectangular shape. That is, the side faces of the cover layer CVL become inclined planes as shown in FIG. 12, and it becomes possible to secure a large electrification region (EA2>EA1) as compared with the case where the sectional shape of the lamination part of the cover layer CVL and the active layer waveguide AWG becomes a trapezoidal shape with a short upper bottom. Thereby, the resistance of the semiconductor device at the time of its operation can be reduced.

Second Embodiment

Figure 17:
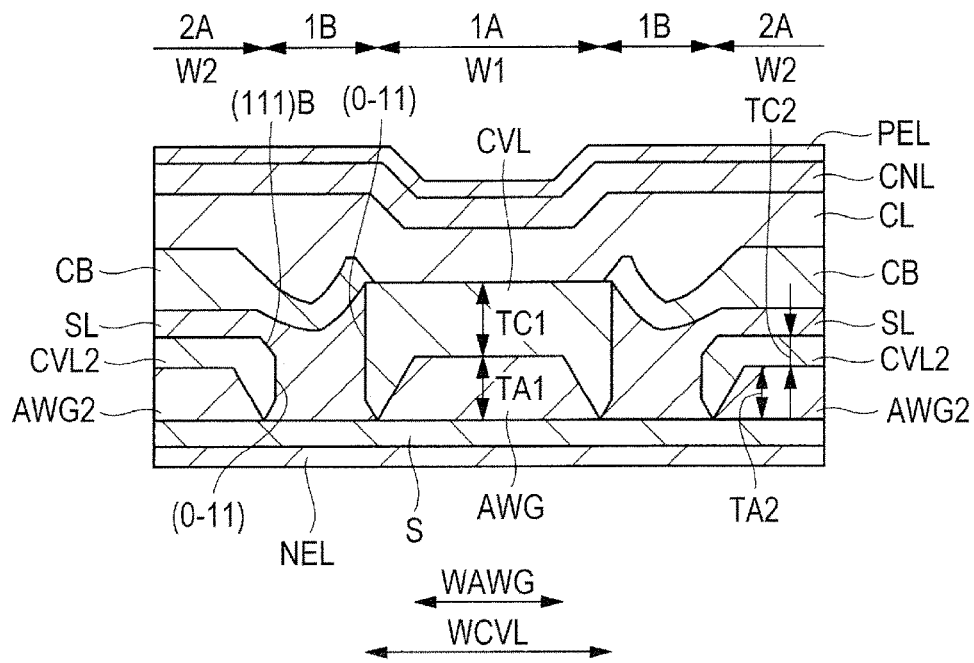
FIG. 17 is a sectional view showing a configuration of a semiconductor device of a second embodiment.
Figure 18:
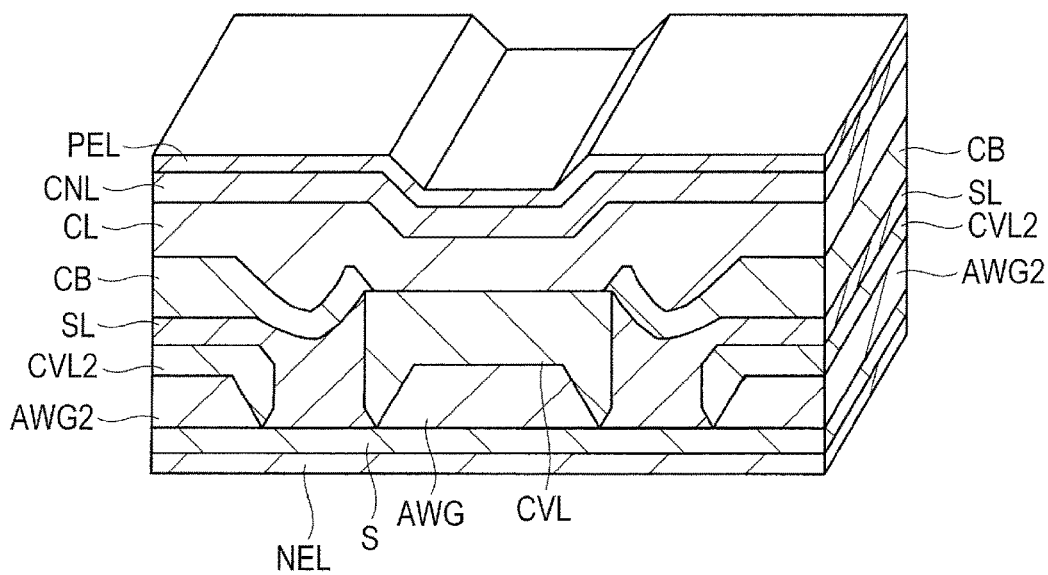
FIG. 18 is a perspective view showing the configuration of the semiconductor device of the second embodiment.

Hereinafter, a semiconductor device of this embodiment will be explained in detail, referring to drawings. FIG. 17 is a sectional view showing a configuration of the semiconductor device of this embodiment. FIG. 18 is a perspective view showing the configuration of the semiconductor device of this embodiment. FIG. 19 to FIG. 28 are sectional views showing a manufacturing process of the semiconductor device of this embodiment.

[Structure Explanation]

The semiconductor device shown in FIG. 17 is a semiconductor laser. This semiconductor device is an embedded semiconductor laser that uses a group III-V compound semiconductor, especially, InP. The semiconductor device of this embodiment has a configuration in which both sides of the lamination part (also called the mesa part) of the active layer waveguide AWG and the cover layer CVL with a semi-insulating group III-V compound semiconductor layer.

As shown in FIG. 17 and FIG. 18, the semiconductor device of this embodiment has the substrate S, the active layer waveguide AWG arranged over the region 1A of the substrate S, and the cover layer CVL arranged over the active layer waveguide AWG. Over the cover layer CVL, the p-electrode (the p-side electrode, the upper part electrode) PEL is arranged through a second cover layer CL and the contact layer CNL; and on the rear face side of the substrate S, the n-electrode (the n-side electrode, the lower part electrode) NEL is arranged. Moreover, the both sides of the lamination part of the active layer waveguide AWG and the cover layer CVL are embedded with a semi-insulating layer SL. In addition, a current blocking layer CB is arranged over this semi-insulating layer SL and the second cover layer CL is further arranged over the semi-insulating layer SL and the cover layer CVL.

The substrate S, the cover layer CVL, and the contact layer CNL are comprised of group III-V compound semiconductors (semiconductor layers).

Moreover, the region 1A of the substrate S, i.e., the formation region of the active layer waveguide AWG is an approximately rectangular region like the case of the first embodiment (refer to FIG. 1B). In other words, it is an approximately rectangular region having a long side in the Y-direction (a depth direction of FIG. 17, the [1-1-1] direction). The regions 1B are arranged on both sides of this region 1A. In other words, the region 1A is demarcated by the regions 1B. The regions 2A are arranged outside the regions 1B. In this region 2A, the active layer waveguide AWG2 and the cover layer CVL2 are arranged sequentially from the bottom. Then, the semi-insulating layer SL covers a top of the cover layer CVL2. Therefore, each layer (AWG2, CVL2) of the region 2A become a layer that does not contribute to the operation of the semiconductor device (the semiconductor laser).

The substrate S is comprised of n-type InP like the case of the first embodiment, and is an inclined substrate whose surface inclines by an angle ranging from 0.5° to 1.0° in the [1-1-1] direction from the (100) plane (refer to FIG. 1B). Such an angle is called the off angle.

The active layer waveguide AWG is comprised of non-doped InP like the case of the first embodiment. This active layer waveguide AWG is formed by epitaxial growth. In this formation, since the substrate S has the above-mentioned off angle, the surface of the active layer waveguide AWG after the growth inclines by an angle ranging from 0.5° to 1.0° in the [1-1-1] direction from the (100) plane.

The cover layer CVL is comprised of a p-type (a second conductivity type) InP layer like the case of the first embodiment. This cover layer CVL is formed by epitaxial growth over the active layer waveguide AWG. The sectional shape of the lamination part of the cover layer CVL after the growth and the active layer waveguide AWG becomes the approximately rectangular shape. Specifically, the width (WCVL) of the surface of the cover layer CVL becomes larger than the width (WAWG) of the surface of the active layer waveguide AWG. Moreover, side faces (side walls) of the lamination part of the cover layer CVL and the active layer waveguide AWG each have the (0-11) plane almost perpendicular to the surface of the substrate S. Thus, by making the sectional shape of the lamination part of the cover layer CVL and the active layer waveguide AWG into the approximately rectangular shape, the electrification region can be enlarged (refer to FIG. 13), and it is possible to reduce the resistance of the semiconductor device at the time of its operation.

This semi-insulating layer SL is arranged so as to adjoin side faces of the lamination part of the active layer waveguide AWG and the cover layer CVL. The semi-insulating layer SL is comprised of, for example, an InP layer (a semiconductor layer) containing Fe (iron). By making the InP layer contain Fe in this way, a flow of electrons can be blocked while reducing a capacity of the layer. For this reason, a high-speed operation of 10 Gbs or more becomes possible. For example, the semi-insulating layer SL has insulation higher than that of the lamination part of the active layer waveguide AWG and the cover layer CVL.

The current blocking layer CB is comprised of, for example, an n-type InP layer (a semiconductor layer). This current blocking layer CB is arranged only over the semi-insulating layer SL, and is not arranged over the top face of the cover layer CVL.

The second cover layer CL is comprised of, for example, the p-type InP layer (the semiconductor layer). This second cover layer CL is arranged over a top face of the current blocking layer CB and the cover layer CVL.

The contact layer CNL is comprised of a group III-V compound semiconductor, and is comprised of, for example, the p-type InGaAs layer. This contact layer CNL is arranged over the second cover layer CL.

The p-electrode PEL is comprised of the multi-layered films of, for example, palladium (Pd) and platinum (Pt). The p-electrode PEL is arranged over the contact layer CNL. Moreover, the n-electrode NEL is comprised of, for example, the multi-layered films of titanium (Ti) and gold (Au). The n-electrode NEL is arranged over the rear face of the substrate S.

The active layer waveguide AWG2 is formed similarly with the active layer waveguide AWG, and is comprised of the same material as that of the active layer waveguide AWG. However, since the X-direction width (W2) of the region 2A in which the active layer waveguide AWG2 is formed is larger than the X-direction width (W1) of the region 1A in which the active layer waveguide AWG is formed, the growth rate per unit area becomes larger than that of the region 2A in the region 1A. Therefore, the film thickness TA1 of the active layer waveguide AWG becomes larger than the film thickness TA2 of the active layer waveguide AWG2 (TA1>TA2). Similarly, although the cover layer CVL2 is formed similarly with the cover layer CVL and is comprised of the same material as that of the cover layer CVL, since the X-direction width (W2) of the region 2A is larger than the X-direction width (W1) of the region 1A, the film thickness TC1 of the cover layer CVL becomes larger than the film thickness TC2 of the cover layer CVL2 (TC1>TC2). Moreover, as described above, the side faces of the cover layer CVL each have the (111)B plane perpendicular to the (100), whereas the side faces of the cover layer CVL2 each have the (111)B plane in addition to the (100) plane.

Since the lamination part of the above-mentioned active layer waveguide AWG2 and cover layer CVL2 is covered with the semi-insulating layer SL, it does not contribute to the operation of the semiconductor device (the semiconductor laser).

Incidentally, since the operation of the semiconductor device (the semiconductor laser) of this embodiment is the same as that of the first embodiment, its explanation is omitted.

[Process Explanation]

Next, a method for manufacturing a semiconductor device of this embodiment will be explained referring to FIG. 19 to FIG. 28 and, at the same time, the configuration of the semiconductor device will be made clearer. FIG. 19 to FIG. 28 are sectional views showing a manufacturing process of the semiconductor device of this embodiment.

Figure 19:
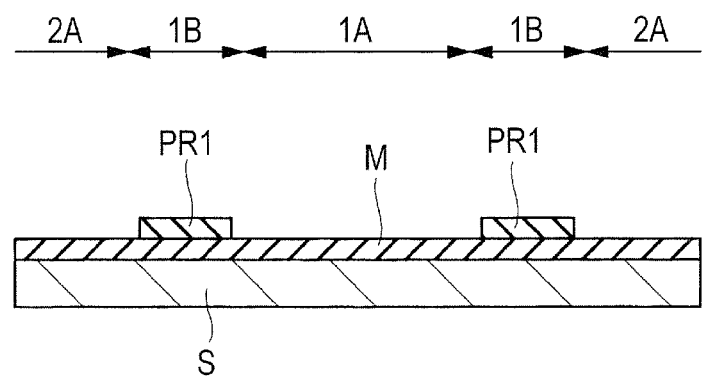
FIG. 19 is a sectional view showing a manufacturing process of the semiconductor device of the second embodiment.

As shown in FIG. 19, the dielectric mask M is formed over the substrate S. The substrate S is comprised of n-type InP, and described above, is an inclined substrate whose surface inclines by an angle ranging from 0.5° to 1.0° in the [1-1-1] direction from the (100) plane (refer to FIG. 1B).

Over the substrate S that is such an inclined substrate, for example, a silicon oxide film is deposited to a film thickness of about 100 nm as the dielectric mask M using the CVD method, etc. Next, the photoresist film PR1 of the region 1A that is the formation region of the active layer waveguide AWG and the regions 2A is removed by forming the photoresist film PR1 over the dielectric mask M and exposing and developing it. In other words, the photoresist film PR1 is made to remain in the regions 1B surrounding the region 1A that is the formation region of the active layer waveguide AWG.

The region 1A that is the formation region of this active layer waveguide AWG is a stripe shape extending in the [0-1-1] direction (refer to FIG. 1B).

Figure 20:
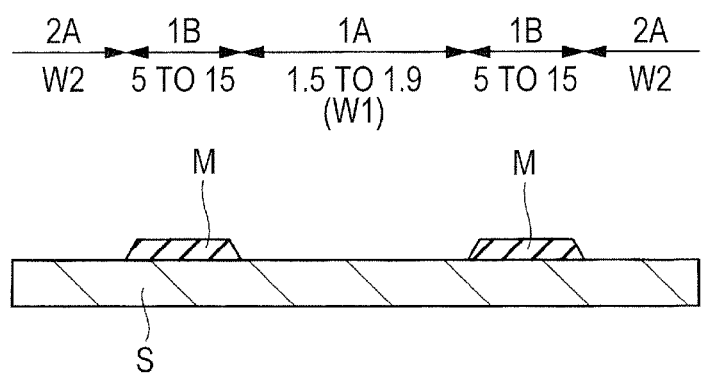
FIG. 20 is a sectional view showing the manufacturing process of the semiconductor device of the second embodiment, and is the sectional view showing manufacturing steps following FIG. 19.

Next, the dielectric mask M is etched using the photoresist film PR1 as a mask. After this, the photoresist film PR1 is removed. Thereby, as shown in FIG. 20, the dielectric mask M with the opening in the region 1A that is the formation region of the active layer waveguide AWG is formed. In other words, the dielectric mask M is formed in the regions 1B surrounding the region 1A that is the formation region of the active layer waveguide AWG. The width of this opening is, for example, about 1.5 to 1.9 µm. This width corresponds to the width W1 of the region 1A in the X-direction. Then, from this opening, the surface that has the off angle of the substrate S is exposed. Moreover, the width of the dielectric mask M that remains is about 5 to 15 µm. In a sectional view of FIG. 20, the dielectric mask M remains on the both sides of the formation region (the region 1A) of the active layer waveguide AWG. In other words, the dielectric mask M about 5 to 15 µm wide is formed with a gap of about 1.5 to 1.9 µm set inbetween. Moreover, the regions 2A are arranged outside the region 1B. In FIG. 20, etc., although only parts of the regions 2A are illustrated, the width of this region 2A (the width W2 in the X-direction) is considerably larger than the width (about 1.5 to 1.9 µm) of the opening, and is about 250 µm, for example.

Figure 21:
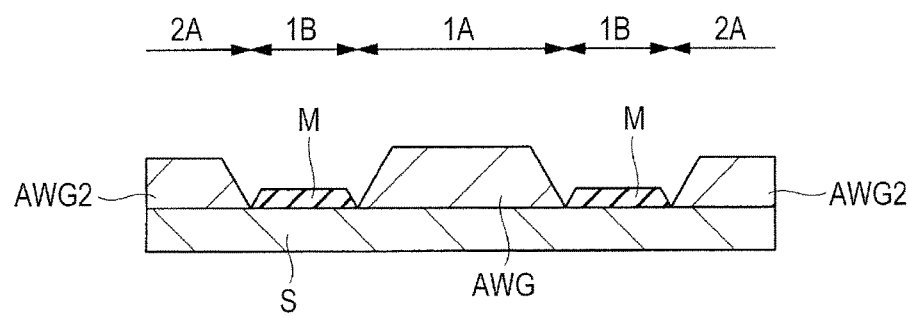
FIG. 21 is a sectional view showing the manufacturing process of the semiconductor device of the second embodiment, and is the sectional view showing manufacturing steps following FIG. 20.

Next, as shown in FIG. 21, the active layer waveguide AWG is formed over the above-mentioned opening (the region 1A), i.e., the exposed part of the surface that has the off angle of the substrate S. Here, the InGaAlAs layer that is a group III-V compound semiconductor is formed as the active layer waveguide AWG using the MOVPE method, etc. In the MOVPE method, the source gas of the group III element and the source gas of the group V element are introduced into the chamber (the processing chamber) using the carrier gas, and the InGaAlAs layer is grown in the opening (the region 1A). TMIn, TEGa, and TMAl can be used as the source gas of In (indium), Ga (gallium), and Al (aluminum). Moreover, $AsH_3$ (arsine) can be used as the source gas of As (arsenic). When mixed source gases arrive at the surface of the heated substrate S, chemical reactions such as decomposition arises, and the InGaAlAs layer grows (deposits) in a state where it succeeds crystalline information of a lower stratum. The active layer waveguide AWG (the InGaAlAs layer) AWG is formed by setting a ratio (also called a V/III ratio) of the flow rate of the source gas (here arsine) of a group V element to a sum of the flow rates of the source gases (here TMIn, TEGa, and TMAl) of group III elements to 200 or less. In this formation, the active layer waveguide AWG2 is formed in the regions 2A.

Figure 22:
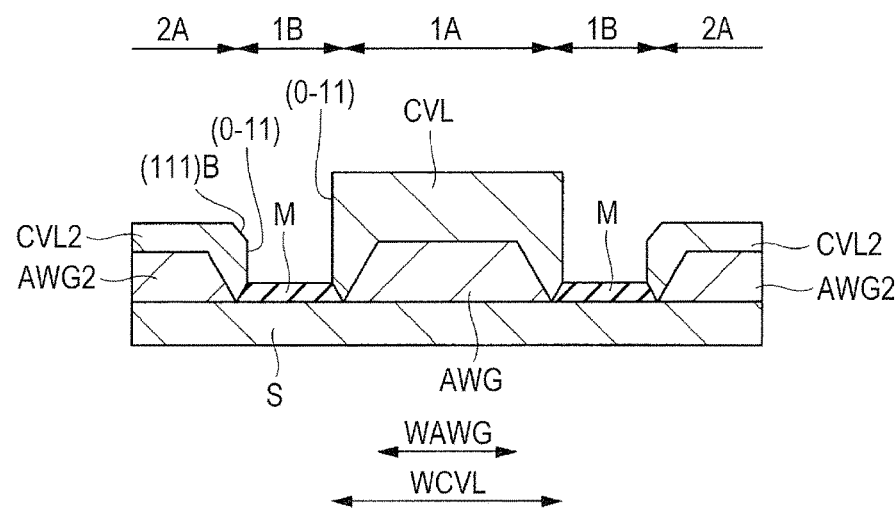
FIG. 22 is a sectional view showing the manufacturing process of the semiconductor device of the second embodiment, and is the sectional view showing manufacturing steps following FIG. 21.

Next, as shown in FIG. 22, the cover layer CVL is formed over the active layer waveguide AWG. Here, the p-type InP layer that is a group III-V compound semiconductor is formed as the cover layer CVL using the MOVPE method, etc. That is, the p-type InP layer is formed continuously (consecutively) in the chamber (the processing chamber) in which the active layer waveguide AWG was formed. In this formation, like at the time of formation of the active layer waveguide AWG (the InP layer) AWG, TMIn is used as the source gas of In, phosphine is used as the source gas of P, and the V/III ratio is set to 2000 or more. Moreover, the p-type InP layer is formed while doping a p-type impurity. As the p-type impurity, Zn can be used, and the p-type InP layer can be formed, for example, by mixing DEZn in the source gas. In this formation, the cover layer CVL2 is formed in the regions 2A.

As mentioned above, in the region 1A of the substrate S, the active layer waveguide AWG and the cover layer CVL are grown sequentially from the bottom, continuously and collectively. In this growth, the active layer waveguide AWG2 and the cover layer CVL2 grow sequentially from the bottom in the region 2A. As described above, since the width (W2) of the region 2A is larger than the width (W1) of the region 1A, the growth rate per unit area becomes large in the region 1A. Therefore, the film thickness TA1 of the active layer waveguide AWG becomes larger than the film thickness TA2 of the active layer waveguide AWG2 (TA1>TA2). Similarly, the film thickness TC1 of the cover layer CVL becomes larger than the film thickness TC2 of the cover layer CVL2 (TC1>TC2). Moreover, the side faces of the cover layer CVL2 become a state where the (111)B plane that is the grown plane before the (0-11) plane is exposed remains. Thereby, the side faces of the cover layer CVL each have the (0-11) plane perpendicular to the (100) plane, whereas the side faces of the cover layer CVL2 each have the (111)B plane in addition to the (0-11) plane.

Thus, since the active layer waveguide AWG was formed so as to extend in the [0-1-1] direction over the surface of the substrate S that has the off angle in the range of 0.5° to 1.0° in the [1-1-1] direction from the (100) plane, a variation of the film thickness (also called a well thickness) of the active layer waveguide AWG can be reduced, and it is possible to obtain excellent multiple quantum wells (MQW). Moreover, since the cover layer CVL comprised of a group III-V compound semiconductor is formed over the active layer waveguide AWG with the high V/III ratio more than or equal to 2000, the cover layer CVL that has the side faces in which the (0-11) plane almost perpendicular to the surface of the substrate S mainly appears from the end of the dielectric mask M can be formed.

Figure 23:
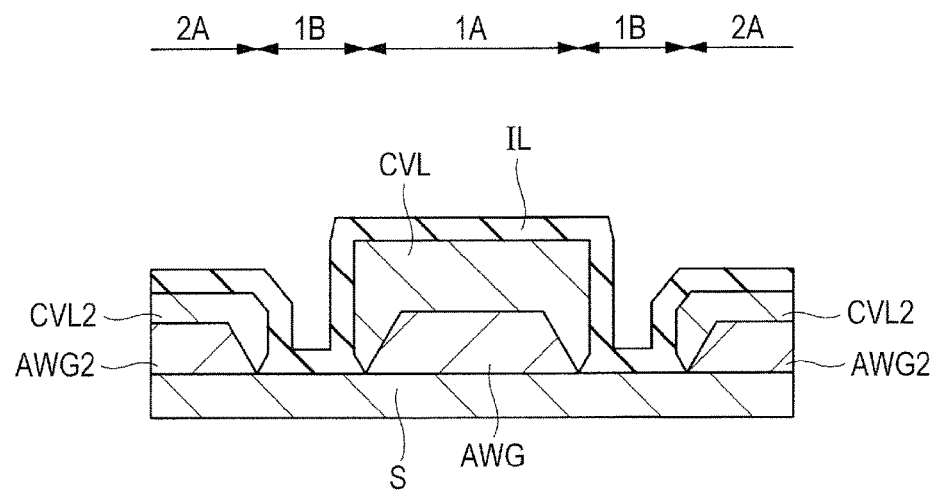
FIG. 23 is a sectional view showing the manufacturing process of the semiconductor device of the second embodiment, and is the sectional view showing manufacturing steps following FIG. 22.

Next, as shown in FIG. 23, the dielectric mask M is removed by etching, and, for example, a silicon oxide film is deposited above the substrate S to a film thickness of about 300 nm using the CVD method, etc. as the dielectric film IL.

Figure 24:
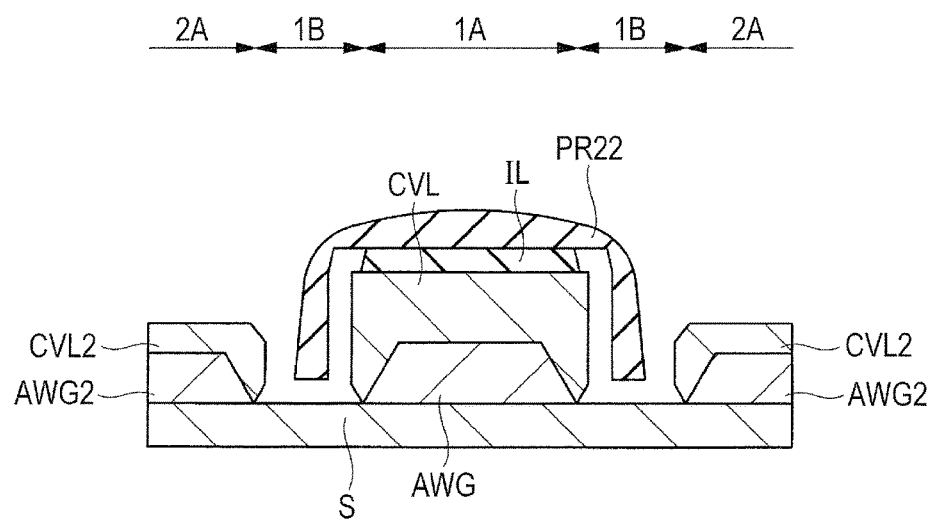
FIG. 24 is a sectional view showing the manufacturing process of the semiconductor device of the second embodiment, and is the sectional view showing manufacturing steps following FIG. 23.
Figure 25:
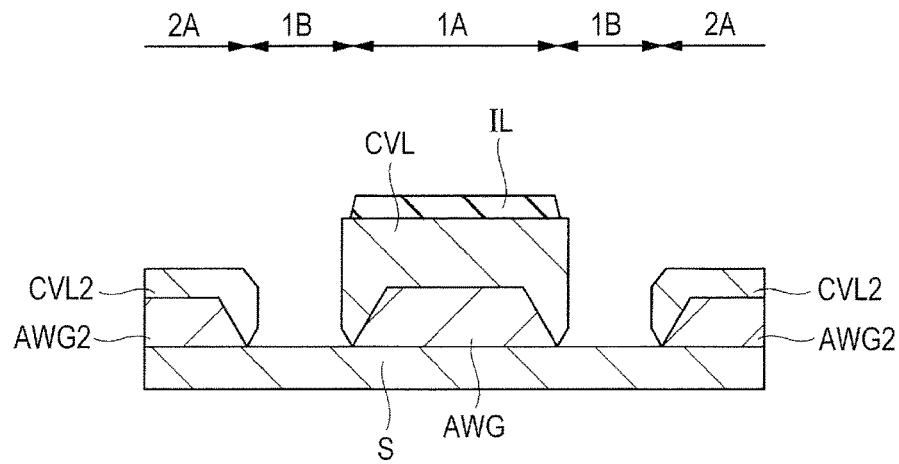
FIG. 25 is a sectional view showing the manufacturing process of the semiconductor device of the second embodiment, and is the sectional view showing manufacturing steps following FIG. 24.

Next, as shown in FIG. 24, a photoresist film PR22 that covers the top face and the side faces of the cover layer CVL through the dielectric film IL is formed by forming a photoresist film over the dielectric film IL and exposing and developing it. Next, the dielectric film IL is wet etched by using the photoresist film PR22 as a mask. In this etching, the dielectric film IL that adjoins the side faces of the cover layer CVL are also etched, and the dielectric film IL remains only over the top face of the cover layer CVL. After this, the photoresist film PR2 is removed. Thereby, as shown in FIG. 25, the top face of the cover layer CVL is covered with the dielectric film IL.

Figure 26:
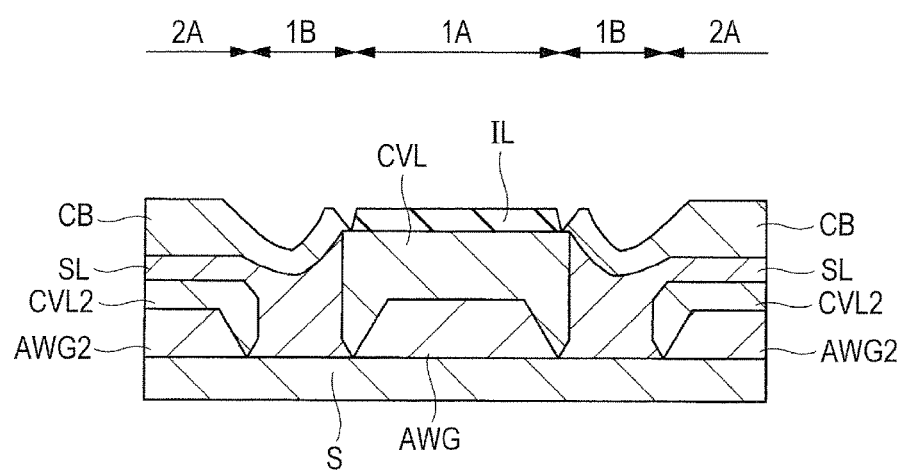
FIG. 26 is a sectional view showing the manufacturing process of the semiconductor device of the second embodiment, and is the sectional view showing manufacturing steps following FIG. 25.

Next, as shown in FIG. 26, a semi-insulating InP layer is formed over the cover layer CVL2 that includes the exposed part top face of the substrate S as the semi-insulating layer SL using the MOVPE method, etc. In order to make the InP layer semi-insulating, for example, Fe is introduced into the layer. For example, the source gas of the group III element and the source gas of the group V element are introduced into the chamber (the processing chamber) using the carrier gas, and the InP layer is grown. In this growth, a Fe containing InP layer that has a semi-insulating characteristic can be formed, for example by mixing ferrocene in the source gas in order to mix Fe therein. Thereby, the both sides of the lamination part of the cover layer CVL and the active layer waveguide AWG can be embedded with the semi-insulating layer SL. Moreover, the cover layer CVL2 top face can be covered with the semi-insulating layer SL.

Next, the n-type InP layer that is a group III-V compound semiconductor is formed over the semi-insulating layer SL as the current blocking layer CB using the MOVPE method, etc. Si can be used as an n-type impurity, and the n-type InP layer can be formed, for example, by mixing $Si_2H_6$ (disilane) in the source gas. Thereby, the both sides of the lamination part of the cover layer CVL and the active layer waveguide AWG can be embedded with multi-layered films of the semi-insulating layer SL and the current blocking layer CB.

Figure 27:
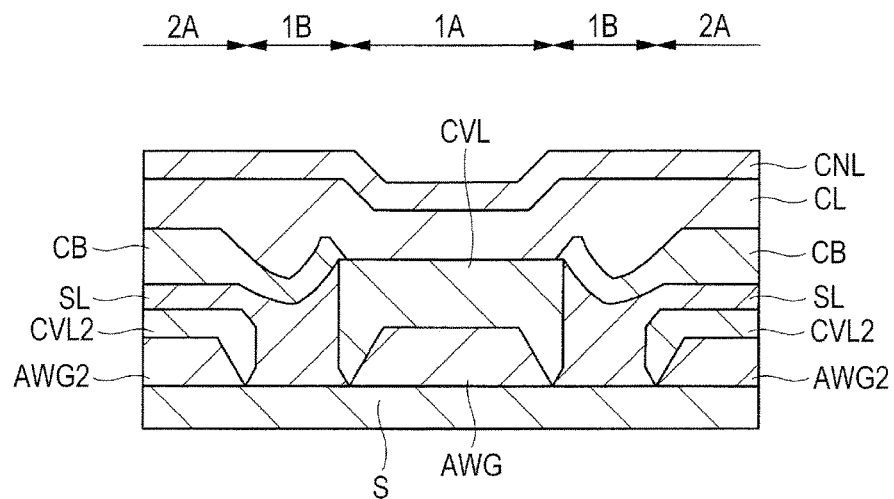
FIG. 27 is a sectional view showing the manufacturing process of the semiconductor device of the second embodiment, and is the sectional view showing manufacturing steps following FIG. 26.

Next, as shown in FIG. 27, the dielectric film IL is removed. Thereby, the top face of the cover layer CVL is exposed. Next, the second cover layer CL is formed over the exposed part of the cover layer CVL and the current blocking layer CB. Here, the p-type InP layer that is a group III-V compound semiconductor is formed as the second cover layer CL using the MOVPE method, etc.

Next, the contact layer CNL is formed over the second cover layer CL. Here, the p-type InGaAs layer that is a group III-V compound semiconductor is formed as the contact layer CNL using the MOVPE method, etc.

Figure 28:
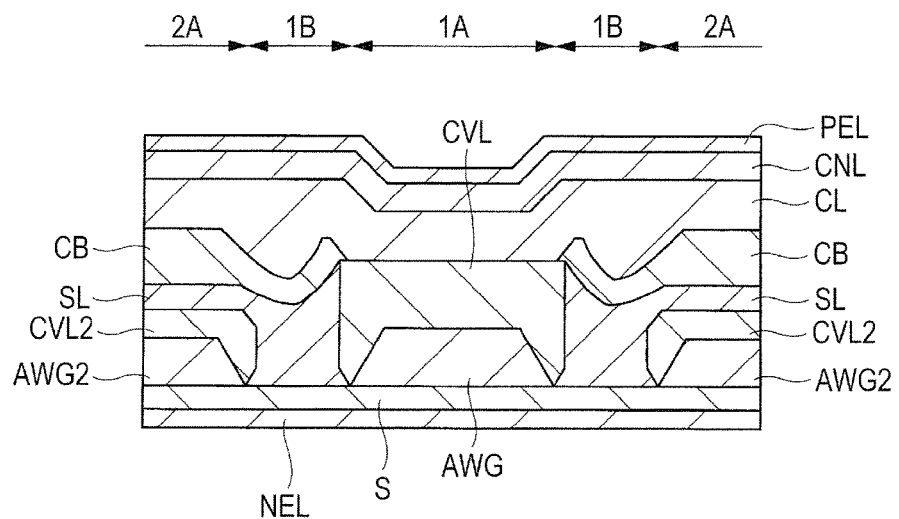
FIG. 28 is a sectional view showing the manufacturing process of the semiconductor device of the second embodiment, and is the sectional view showing manufacturing steps following FIG. 27.

Next, as shown in FIG. 28, the p-electrode PEL is formed over the contact layer CNL. Moreover, the n-electrode NEL is formed over the rear face of the substrate S. For example, the multi-layered films of, for example, the palladium (Pd) film and the platinum (Pt) film are formed over the contact layer CNL as the p-electrode PEL. These films can be formed using the spattering technique, the evaporation method, etc. Next, the p-electrode PEL is formed by patterning the multi-layered films to a desired shape. Next, the substrate S is thinned by making the rear face side of the substrate S face upward and grinding the rear face of the substrate S. Next, the multi-layered films of, for example, the titanium (Ti) film and the gold (Au) film are formed over the rear face of the substrate S as the n-electrode NEL. These films can be formed using the spattering technique, the evaporation method, etc. Incidentally, other metallic films may be used as the p-electrode PEL and the n-electrode NEL.

By the above process, the semiconductor device shown in FIG. 17 can be formed.

Thus, also in this embodiment, since the active layer waveguide AWG was formed over the substrate S having the off angle and the cover layer CVL was formed over it with the high V/III ratio, the growth section of the cover layer CVL becomes large like the case of the first embodiment, and it is possible to secure a large electrification region. Thereby, it is possible to reduce the resistance of the semiconductor device at the time of its operation.

Especially, in this embodiment, since the side faces of the cover layer CVL are embedded with the semi-insulating layer SL using InP that is a material whose thermal conductivity is better than that of the dielectric layer, heat dissipation can be improved and a temperature characteristic of the semiconductor device can be improved. Furthermore, by covering the top face of the cover layer CVL with the second cover layer CL using a material whose thermal conductivity is excellent (for example, an InP layer), the heat dissipation can be improved and the temperature characteristic of the semiconductor device can be improved.

Modification

In the first and second embodiments, a single layer film comprised of the p-type InGaAs layer was used as the contact layer CNL, the contact layer CNL may be configured to be multi-layered films.

Figure 29:
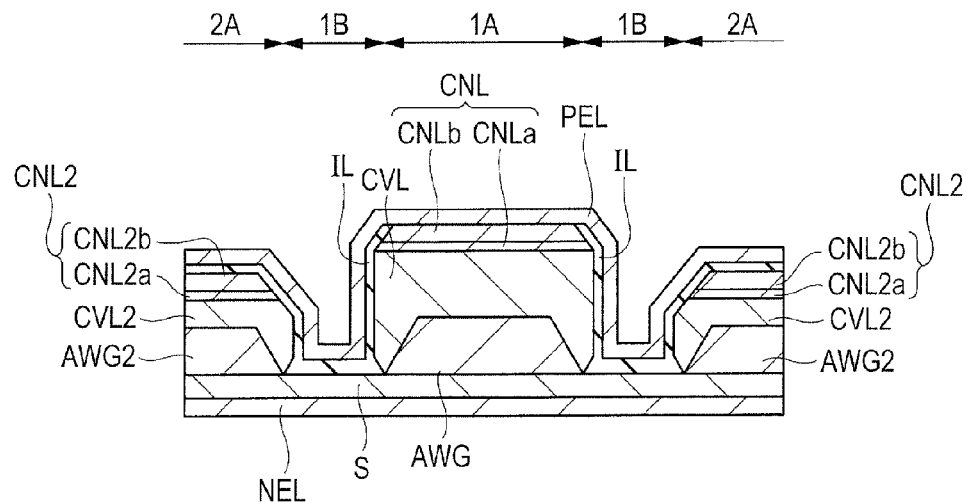
FIG. 29 is a sectional view showing a configuration of a modification of the semiconductor device of the first embodiment.

FIG. 29 is a sectional view showing a configuration of a semiconductor device that is a modification of the first embodiment. Since the configuration other than that of the contact layers CNL, CNL2 and its manufacturing process are the same as those of the first embodiment (FIG. 1, etc.), their detailed explanations are omitted.

As shown in FIG. 29, in the modification of the first embodiment, the contact layer CNL is comprised of multi-layered films of a first layer CNLa and a second layer CNLb over it.

The first layer CNLa is comprised of a group III-V compound semiconductor, and is comprised of, for example, the p-type InGaAs layer. Moreover, the second layer CNLb is comprised of a group III-V compound semiconductor, and is comprised of, for example, a p-type InGaAsP layer.

Incidentally, the contact layer CNL2 is similarly comprised of multi-layered films of a first layer (for example, the p-type InGaAs layer) CNL2a and a second layer (for example, the p-type InGaAsP layer) CNL2b over it.

The contact layers CNL, CNL2 of such a lamination structure can be formed using the MOVPE method, etc. That is, the contact layers CNL, CNL2 are continuously formed in the chamber (the processing chamber) in which the active layer waveguide AWG and the cover layer CVL were formed. For example, the p-type InGaAs layer (the first layers CNLa, CNL2a) is formed by the MOVPE method that uses, for example, TMIn as the source gas of In, TMGa as the source gas of Ga (gallium), and $AsH_3$ (arsine) as the source gas of As (arsenic). Then, the p-type InGaAsP layer (the second layers CNLb, CNL2b) is formed by adding $PH_3$ (phosphine) to the above-mentioned source gas as the source gas of P. Incidentally, DEZn can be used as a p-type impurity, and the p-type layer can be formed, for example, by mixing DEZn in the source gas.

Figure 30:
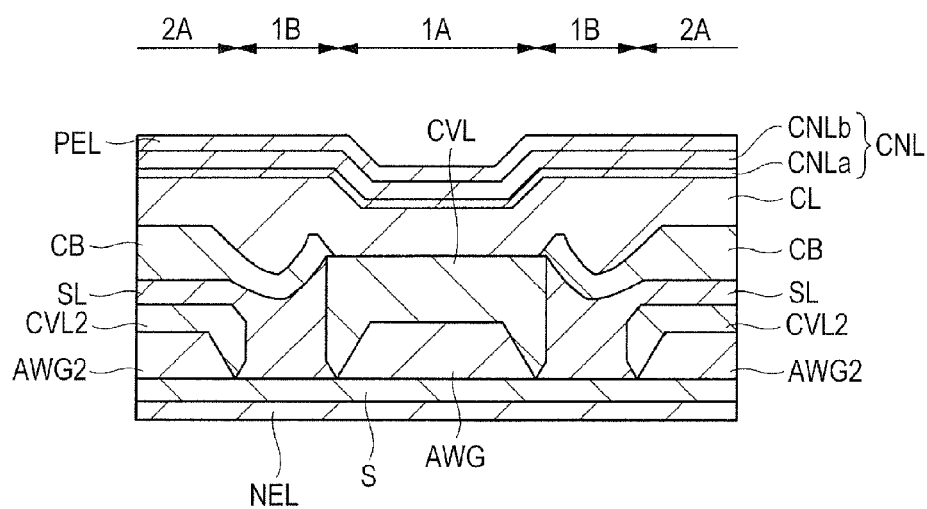
FIG. 30 is a sectional view showing a configuration of a modification of the semiconductor device of the second embodiment.

FIG. 30 is a sectional view showing a configuration of a semiconductor device that is a modification of the second embodiment. Since the configuration other than that of the contact layers CNL, CNL2 and its manufacturing process are the same as those of the second embodiment (FIG. 17, etc.), their detailed explanations are omitted.

As shown in FIG. 30, in the modification of the second embodiment, the contact layer CNL is comprised of multi-layered films of the first layer CNLa and the second layer CNLb over it.

The first layer CNLa is comprised of a group III-V compound semiconductor, and is comprised of, for example, the p-type InGaAs layer. Moreover, the second layer CNLb is comprised of a group III-V compound semiconductor, and is comprised of, for example, the p-type InGaAsP layer.

The contact layer CNL of such a lamination structure can be formed using the MOVPE method, etc. That is, the contact layer CNL is continuously formed in the chamber in which the active layer waveguide AWG and the cover layer CVL were formed. For example, the p-type InGaAs layer (the first layer CNLa) is formed by the MOVPE method, for example, in which TMIn is used as the source gas of In, TMGa is used as the source gas of Ga, $AsH_3$ is used as the source gas of As. Then, as the source gas of P, $PH_3$ is added to the above-mentioned source gas, and the p-type InGaAsP layer (the second layer CNLb) is formed. Incidentally, as a p-type impurity, Zn can be used, and the p-type layer can be formed, for example, by mixing DEZn in the source gas.

Although there is no restriction in an application part of the semiconductor device (the semiconductor laser) explained in the above-mentioned embodiments and modifications, it can be used as a semiconductor device (a semiconductor laser) for optical communications of 1.25 to 1.65 μm bands, for example.

In the foregoing, although the invention made by the present inventors was concretely explained based on the embodiments, it goes without saying that the present invention is not limited to the above-mentioned embodiments, and can be modified variously within a range that does not deviate from the gist of the present invention.

What is claimed is:

1. A semiconductor device, comprising:
   a substrate;
   a first semiconductor layer arranged in a first region of the substrate; and a second semiconductor layer arranged over the first semiconductor layer,
   wherein the substrate inclines by an angle ranging from 0.5 to 1.00 in a [1-1-1] direction from a (100) plane,
   wherein the substrate, the first semiconductor layer, and the second semiconductor layer are comprised of group III-V compound semiconductors,
   wherein the substrate, the first semiconductor layer, and the second semiconductor layer are comprised of InP,
   wherein side faces of the second semiconductor layer each have a (0-11) plane, and
   the semiconductor device further comprises:
   a second lamination part that is arranged being separated from a first lamination part of the first semiconductor layer and the second semiconductor layer,
   wherein the second lamination part has a third semiconductor layer arranged in a second region of the substrate and a fourth semiconductor layer arranged over the third semiconductor layer, and
   wherein a thickness of the first semiconductor layer is larger than a thickness of the third semiconductor layer.

2. The semiconductor device according to claim 1, further comprising:
   a first electrode arranged above the second semiconductor layer; and
   a second electrode arranged over a rear face of the substrate.

3. The semiconductor device according to claim 1, wherein the first lamination part of the first semiconductor layer and the second semiconductor layer extends in a first direction, and
   wherein a sectional shape of the first lamination part, in a second direction intersecting the first direction, is an approximately rectangular shape.

4. The semiconductor device according to claim 1, wherein side faces of the first lamination part of the first semiconductor layer and the second semiconductor layer are almost perpendicular to the (100) plane.

5. The semiconductor device according to claim 1, wherein the first semiconductor layer and the second semiconductor layer extend in a first direction, and
   wherein a width of a top face of the second semiconductor layer in a second direction intersecting the first direction is larger than a width of a top face of the first semiconductor layer in the second direction.

6. The semiconductor device according to claim 1, further comprising:
   layers each comprised of InP containing Fe on both sides of the first lamination part of the first semiconductor layer and the second semiconductor layer.

7. The semiconductor device according to claim 1, wherein a thickness of the second semiconductor layer is larger than a thickness of the fourth semiconductor layer.

* * * * *